United States Patent
Cunha et al.

(10) Patent No.: US 11,461,518 B2
(45) Date of Patent: Oct. 4, 2022

(54) MULTI-INSTANCED SIMULATIONS FOR LARGE ENVIRONMENTS

(71) Applicant: Dassault Systemes, Vélizy-Villacoublay (FR)

(72) Inventors: Guilherme Cunha, Vélizy-Villacoublay (FR); Everton Hermann, Vélizy-Villacoublay (FR); Cyril Ngo Ngoc, Vélizy-Villacoublay (FR)

(73) Assignee: Dassault Systemes, Vélizy-Villacoublay (FR)

( * ) Notice: Subject to any disclaimer, the term of this patent is extended or adjusted under 35 U.S.C. 154(b) by 174 days.

(21) Appl. No.: 16/724,761

(22) Filed: Dec. 23, 2019

(65) Prior Publication Data

US 2020/0202052 A1 Jun. 25, 2020

(30) Foreign Application Priority Data

Dec. 21, 2018 (EP) ..................................... 18306833

(51) Int. Cl.
  *G06F 30/20* (2020.01)
  *G06F 30/17* (2020.01)

(52) U.S. Cl.
  CPC .............. *G06F 30/20* (2020.01); *G06F 30/17* (2020.01)

(58) Field of Classification Search
  CPC .................................. G06F 30/20; G06F 30/17
  See application file for complete search history.

(56) References Cited

U.S. PATENT DOCUMENTS

| | | | |
|---|---|---|---|
| 2009/0306943 A1* | 12/2009 | Abdel-Khalik | G06F 30/20 703/2 |
| 2014/0180653 A1* | 6/2014 | Belmans | G06F 30/20 703/2 |
| 2016/0179992 A1* | 6/2016 | Van der Velden | G06F 30/00 703/2 |

(Continued)

OTHER PUBLICATIONS

Bergmann, M., Ferrero, A., Iollo, A., Lombardi, E., Scardigli, A. and Telib, H., 2018. A zonal Galerkin-free POD model for incompressible flows. Journal of Computational Physics, 352, pp. 301-325. (Year: 2017).*

(Continued)

*Primary Examiner* — Chuen-Meei Gan
(74) *Attorney, Agent, or Firm* — Oblon, McClelland, Maier & Neustadt, L.L.P.

(57) ABSTRACT

The disclosure notably relates to a computer-implemented method for instancing a global physics simulation. The method includes obtaining a set of local simulations. The set of local simulations includes at least one local simulation. A local simulation is a physics simulation that is part of the global physics simulation and that can be computed alone and independently of the global physics simulation. Each local simulation of the set of local simulations is already computed. The method further includes, for each local simulation of the set of local simulations, computing a respective reduced model of the local simulation. The method further includes computing each global simulation of a set of at least one global simulation. Each global simulation is an instance of the global physics simulation. This constitutes an improved method for instancing a physics simulation.

20 Claims, 13 Drawing Sheets

(56) References Cited

U.S. PATENT DOCUMENTS

2016/0179998 A1* 6/2016 Gueguen ............... G06F 30/20
703/1

OTHER PUBLICATIONS

M. Errera, A. Dugeai, P. Girodroux-Lavigne, J.D. Garaud, M. Poinot, et al.. Multi-Physics Coupling Approaches for Aerospace Numerical Simulations.. Aerospace Lab, Alain Appriou, 2011, p. 1-16. (Year: 2011).*

European Search Report dated Jun. 7, 2019, in Patent Application No. 18306833.7.

European Search Report dated Jun. 7, 2019, in Patent Application No. 18306834.5.

Extended European Search Report dated Aug. 1, 2019, in Patent Application No. 18306832.9.

Michel Bergmann, et al., "A zonal Galerkin-free POD model for incompressible flows", Journal of Computational Physics, vol. 352, XP055593066, 2018, pp. 301-325.

Emiliano Iuliano, et al., "Proper Orthogonal Decomposition, surrogate modelling and evolutionary optimization in aerodynamic design", Computers and Fluids, vol. 84, XP028684771, 2013, pp. 327-350.

Marijn P. Zwier, et al., "Physics in Design: Real-time numerical simulation integrated into the CAD Environment", Procedia CIRP, 27th CIRP Design, vol. 60, 2017, pp. 98-103.

Katrina Calautit, et al., "A Review of Numerical Modelling of Multi-Scale Wind Turbines and Their Environment", Computation, vol. 6, No. 24, Mar. 5, 2018, pp. 1-37.

Sara Louise Walker, et al., "Building mounted wind turbines and their suitability for the urban scale—A review of methods of estimating urban wind resource", Energy and Buildings, vol. 43, 2011, pp. 1852-1862.

Hong Huang, et al., "Urban thermal environment measurements and numerical simulation for an actual complex urban area covering a large district heating and cooling system in summer," Atmospheric Environment, vol. 39, Issue 34, 2005, pp. 6362-6375.

Stephane Redonnet, "Development of a Hybrid Methodology for the Numerical Simulation in Aeroacoustics, with Application to the Mitigation of Aircraft Noise", [physics.class-ph] Aix-Marseille Universite, Thesis for an Accreditation to Supervise Research, Accreditation to Supervise Research (HDR), 2016, 251 pages.

J. Blazek, "Computational Fluid Dynamics: Principles and Applications", Elservier Science, 2001, 456 pages.

Matthew F. Barone, et al., "Reduced Order Modeling of Fluid/Structure Interaction," Sandia National Laboratories Sandia Report, Sand No. 7189, Sep. 2009, 122 pages.

C. W. Rowley, "Model Reduction for Fluids, Using Balanced Proper Orthogonal Decomposition", Modeling and Computations in Dynamical Systems: In Commemoration of the 100th Anniversary of the Birth of John Von Neumann, vol. 13, Series B, 2006, pp. 301-317.

Clarence W. Rowley, et al., "Model reduction for compressible flows using POD and Galerkin projection", Physica D: vol. 189, 2004, pp. 115-129.

Francisco Chinesta, et al., "Model Order Reduction", Encyclopedia of Computational Mechanics, 2004, 59 pages.

K. Veroy, et al., "Certified real-time solution of the parametrized steady incompressible Navier-Stokes equations: rigorous reduced-basis a posteriori error bounds", International Journal for Numerical Methods in Fluids, vol. 47, XP055609183, 2005, pp. 773-788.

Alan Norton, et al., "The VAPOR Visualization Application" High Performance Visualization: Enabling Extreme-Scale Scientific Insight, Chapter 20, XP055602266, Oct. 25, 2012, pp. 73-85.

S. Li, et al., "Data Reduction Techniques for Simulation, Visualization and Data Analysis", Computer Graphics Forum, vol. 37, No. 6, XP055602247, 2018, pp. 422-447.

Lawrence Ibarria, et al., "Out-of-core compression and decompression of large n-dimensional scalar fields", Eurographics, vol. 22, No. 3, 2003, pp. 343-348.

Stefan Guthe, et al., "Real-time Decompression and Visualization of Animated Volume Data", IEEE Visualization, Oct. 21-26, 2001, pp. 9 pages.

John D. Villasenor, et al., "Seismic Data Compression Using High-Dimensional Wavelet Transforms", IEEE Proceedings of Data Compression Conference—DCC '96, 1996, pp. 396-405.

Shaomeng Li, et al., "Spatiotemporal Wavelet Compression for Visualization of Scientific Simulation Data", IEEE International Conference on Cluster Computing, 2017, pp. 216-227.

Aaron Trott, et al., "Wavelets Applied to Lossless Compression and Progressive Transmission of Floating Point Data in 3-D Curvilinear Grids", Proceedings of the 7th IEEE Visualization Conference (VIS'96), 1996, 4 pages.

"SIMULIA Introduction Training: Efficient training to learn new software: Introcourses for Abaqus, Isight, fe-safe, Tosca & 3DEXPERIENCE Platform", Simuleon by Techna, https://www.simuleon.com/simulia-introduction-training/, Aug. 7, 2020, 15 pages.

"Complete Solutions for Realistic Simulation", Abaqus Unified FEA, Dassault Systèmes, https://www.3ds.com/products-services/simulia/products/abaqus/, Aug. 7, 2020, 4 pages.

"Computational Fluid Dynamics Simulation Software Improving Product Design & Development", Powerflow, CFD Software Solution for Aerodynamic Design—Dassault Systèmes, https://www.3ds.com/products-services/simulia/products/powerflow/, Aug. 7, 2020, 5 pages.

"Fluids Simulations to Improve Real-World Performance", Xflow, High Fidelity CFD—Dassault Systèmes, https://www.3ds.com/products-services/simulia/products/xflow/, Aug. 7, 2020, 4 pages.

* cited by examiner

MULTI-INSTANCED SIMULATIONS FOR LARGE ENVIRONMENTS

CROSS-REFERENCE TO RELATED APPLICATIONS

This application claims priority under 35 U.S.C. § 119 or 365 to European Application No. 18306833.7, filed Dec. 21, 2018. The entire contents of the above application(s) are incorporated herein by reference.

FIELD OF THE INVENTION

The disclosure relates to the field of engineering and physics simulations.

BACKGROUND

Nowadays, great attention is paid to the development of renewable and sustainable technologies, such as renewable energy sources, development of clean-smart cities, conception of transportation means coping with environmental rules to name a few.

In order to make viable the development of sustainable solutions to development of renewable and sustainable technologies, it is well accepted that the use of Numerical Simulation tools is mandatory. As a matter of fact, the need to take into account the presence of uncertain conditions on a large scale (wind speed, building distribution, weather conditions during aircraft travels, etc) and interaction effects between different elements of a given scene (different buildings, different wind turbines, different parts of an aircraft, etc.) make it unviable the use of experiments in the design phase.

Concurrently, an established way of evaluating a design is using numerical methods via dedicated software. However, setting up numerical simulations in early design phases is very consuming, in particular when the environment (the environment is also referred to as the scene, where the scene is the 3D space in which the simulation is executed) to which the new design will be submitted changes repeatedly. This is largely due to the fact that, for each environment change, the scene must be adapted accordingly, i.e. one needs to re-mesh, re-apply boundary conditions and re-calculate the entire solution (see Marijn P. Zwier, Wessel W. Wits. "Physics in Design: Real-time Numerical Simulation Integrated into the CAD Environment". Procedia CIRP, Volume 60, 2017, Pages 98-103, ISSN 2212-8271, doi.org/10.1016/j.procir.2017.01.054). Also, in the case of large domains, i.e. large scene environments, the cost associated with simulation means (simulation time, data storage, etc.) grows exponentially (see J. Blazek. "Computational Fluid Dynamics: Principles and Applications". ISBN: 978-0-08-044506-9. Elservier Science, 2005, 2nd Edition).

For large scale simulations, such as fluid flows simulations, structural mechanics simulations, plasma dynamics simulations, physics simulations that can make use of multi-instancing, or simulations for any field needing the use of physical models simulated in a virtual world (such as video games or animated movies), one needs to run the simulation tool for the entire domain. When facing the need of instancing a large scale simulation, only solutions that re-run the entire simulation for each small modification of the scene are known. Such solutions are not adapted to the instancing of large scale simulations where one needs to change the scene disposition a lot.

Within this context, there is still a need for an improved method for instancing a physics simulation.

SUMMARY OF THE INVENTION

It is therefore provided a computer-implemented method for instancing a global physics simulation. The method comprises providing a set of local simulations. The set of local simulations comprises at least one local simulation. A local simulation is a physics simulation that is part of the global physics simulation and that can be computed alone and independently of the global physics simulation. Each local simulation of the set of local simulations is already computed. The method further comprises, for each local simulation of the set of local simulations, computing a respective reduced model of the local simulation.

The method further comprises computing each global simulation of a set of at least one global simulation. Each global simulation is an instance of the global physics simulation. The computing of each global simulation comprises reusing each respective computed reduced model of each local simulation of at least one local simulation.

This constitutes an improved method for instancing a physics simulation.

The method may comprise one or more of the following:
- each local simulation is associated with a respective local domain and each global simulation is associated with a respective global domain, and the method further comprises:
  - before the computing of each respective reduced model of each local simulation:
    - selecting a respective zone of interest of the local simulation, the respective zone of interest being a non-empty sub-domain of the respective local domain;
  - at the computing of each respective reduced model of each local simulation:
    - each respective reduced model of each local simulation is computed at the border of the respective zone of interest;
  - at the computing of each global simulation:
    - placing the respective zone of interest of each local simulation of the at least one local simulation in the respective global domain of the global simulation; and
    - only the remaining part of the global domain is computed, the remaining part being the part of the global domain that is occupied by no zone of interest, the global domain comprising regions that are respectively occupied by each respective zone of interest of each local simulation of the at least one local simulation;
- the method further comprises, at the placing of the respective zone of interest of each local simulation of the at least one local simulation, interfacing the border of the respective zone of interest with the border of the region of the respective global domain occupied by the respective zone of interest;
- each local domain of each local simulation comprises a respective physical object, the local simulation simulating a respective physical behavior associated with the respective physical object, and each global simulation simulates a respective scenario of a common physical behavior associated with all respective physical objects of each local simulation of the at least one local simulation, the common physical behavior being common to all global simulations;

for each global simulation, the respective global domain of the global simulation comprises a respective variation of a common physical object, and the common physical object is common to all global simulations, and the common physical behavior associated with all respective physical objects of each local simulation of the at least one local simulation is a physical behavior of the common physical object relatively to all respective physical objects of each local simulation of the at least one local simulation;

the method further comprises:
  before the computing of each global simulation:
    creating a database of local simulation instances, the creating of the database comprising:
      the providing of the set of local simulations and the computing of each respective reduced model of each local simulation, the set of local simulations comprising at least two local simulations; and
      for each local simulation of the set of local simulations, storing in the database a respective local simulation instance, the respective local simulation instance comprising the respective computed reduced model;
    selecting at least two local simulation instances in the database of local simulation instances;
  at the computing of each global simulation, the at least one local simulation consists in the at least two local simulations of the at least two selected local simulation instances;

the method further comprises, for each local simulation of the set of local simulations, after the computing of the respective reduced model, defining probes, the probes being points of the respective local domain of the local simulation which are contiguous to the respective zone of interest, each probe comprising simulation data of the local simulation, wherein the stored local simulation instance comprising the respective computed reduced model further comprises the probes and the respective zone of interest;

during the computing of each global simulation, at least two local simulations instances of the at least two selected local simulation instances interact, the interaction resulting in that probes of at least one local simulation instance of the at least two local simulation instances are enriched, and as a result of enriching probes, the respective computed reduced model comprised in a local simulation instance of which probes are enriched is corrected;

the method further comprises, for each local simulation instance of which probes are enriched:
  before the correcting of the respective computed reduced model, computing a difference between the set of all enriched probes and the set of corresponding probes before their enrichment;
  determining if the difference exceeds a predetermined threshold; and
  correcting the respective computed reduced model if it is determined that the difference exceeds the predetermined threshold;

the method further comprises:
  at the creating of the database of local simulation instances, learning a machine-learning algorithm on the local simulation instances stored in the database, the machine-learning algorithm providing, for each local simulation instance of the database, a respective relation between the probes stored in the local simulation instance and the respective computed reduced model stored in the local simulation instance; and
  for each local simulation instance of which probes are enriched, correcting the respective computed reduced model comprised in the local simulation instance comprises applying the machine-learning algorithm, the correcting being performed based on the respective relation;

the set of local simulations consists in exactly one local simulation;

all local simulations of the set of local simulations are perturbations of a given local simulation, the given local simulation being also part of the set of local simulations; and/or all global simulations are perturbations of a given global simulation, the given global simulation being also part of the set of global simulations.

It is further provided a computer program comprising instructions for performing the method.

It is further provided a computer readable storage medium having recorded thereon the computer program.

It is further provided a computer comprising a processor coupled to a memory and a display, the memory having recorded thereon the computer program.

BRIEF DESCRIPTION OF THE DRAWINGS

Examples of the embodiments will now be described, by way of non-limiting example, and with reference to the accompanying drawings, where.

DETAILED DESCRIPTION OF THE INVENTION

Figure 1:
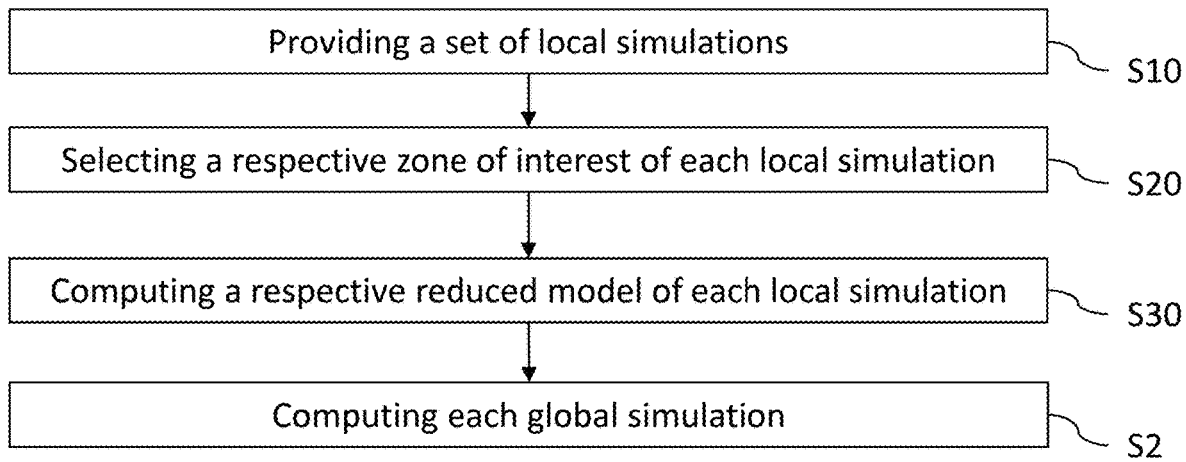
FIG. 1 shows a flowchart of an example of the method.

With reference to the flowchart of FIG. 1, it is provided a computer-implemented method for instancing a global physics simulation. The method comprises providing S10 a set of local simulations. The set of local simulations comprises at least one local simulation. A local simulation is a physics simulation that is part of the global physics simulation and that can be computed alone and independently of the global physics simulation. Each local simulation of the set of local simulations is already computed. The method further comprises, for each local simulation of the set of local simulations, computing S30 a respective reduced model of the local simulation. The method further comprises computing S2 each global simulation of a set of at least one global simulation. Each global simulation is an instance of the global physics simulation. The computing S2 of each global simulation comprises reusing S220 each computed reduced model of each local simulation of at least one local simulation.

Such a method improves the instancing of a physics simulation. First, local part(s) of the global physics simulation, namely the local simulation(s) of which computed reduced model is(are) reused, is(are) already computed. When computing the global physics simulation, the method computes instance(s), namely the global simulation(s), of the global physics simulation without computing the already computed local part(s). Thus, one can instantiate the global physics simulation without having to entirely re-run it (that is, without to entirely recompute it) at each instantiation. In other words, the method allows to instantiate a physics simulation relatively fast, and with an economical use of computer resources. Second, only the reduced model(s) of already computed local part(s) of the global physics simulation is(are) reused when computing S2 the global simulation(s). The reduced model of a simulation costs less to store and/or to run (in terms of data and/or computing resources to use) than the simulation itself but still captures the physics of the simulation. As such, each reduced model that is reused is substantially equivalent to a simulation result of the corresponding local simulation. This implies that the method not only computes instances of a physics simulation in a faster and economical way but does so while guaranteeing a certain physical accuracy. The advantages of the method are particularly emphasized when the set of at least one global simulation comprises at least two global simulations. Indeed, one may compute several versions (the at least two global simulations) of a large scale simulation (the global physics simulation) having a common part (the local simulation(s)) without having to recompute the common part each time. The method thus makes it possible to simulate variations of the global physics simulation without a sequential approach where the simulation must be entirely re-run each time a modification is made to create a new instance (i.e. a new variation). Moreover, the sequential approach is not adapted for simulating a global multi-physics simulation where two physics models from two different fields of physics strongly interact, whereas the present approach can efficiently handle this case. Furthermore, in examples, each local simulation has a time scale that is different from the time scale of the global simulation(s). These multiscale issues may make the computing of the global physics simulation complicated and/or costlier in terms of time and/or computing resources, because different physics models may evolve at different time scales which all need to be considered. By not recomputing the local simulations, the computing S2 of the global simulation according to the present embodiments may only consider the time scale of each global simulation and not the time scales of the local simulations, thus reducing or even avoiding these multiscale issues.

In all the present description, including the above and the following, at least one means one or more and at least two means two or more.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system (e.g. a computer system) adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 6:
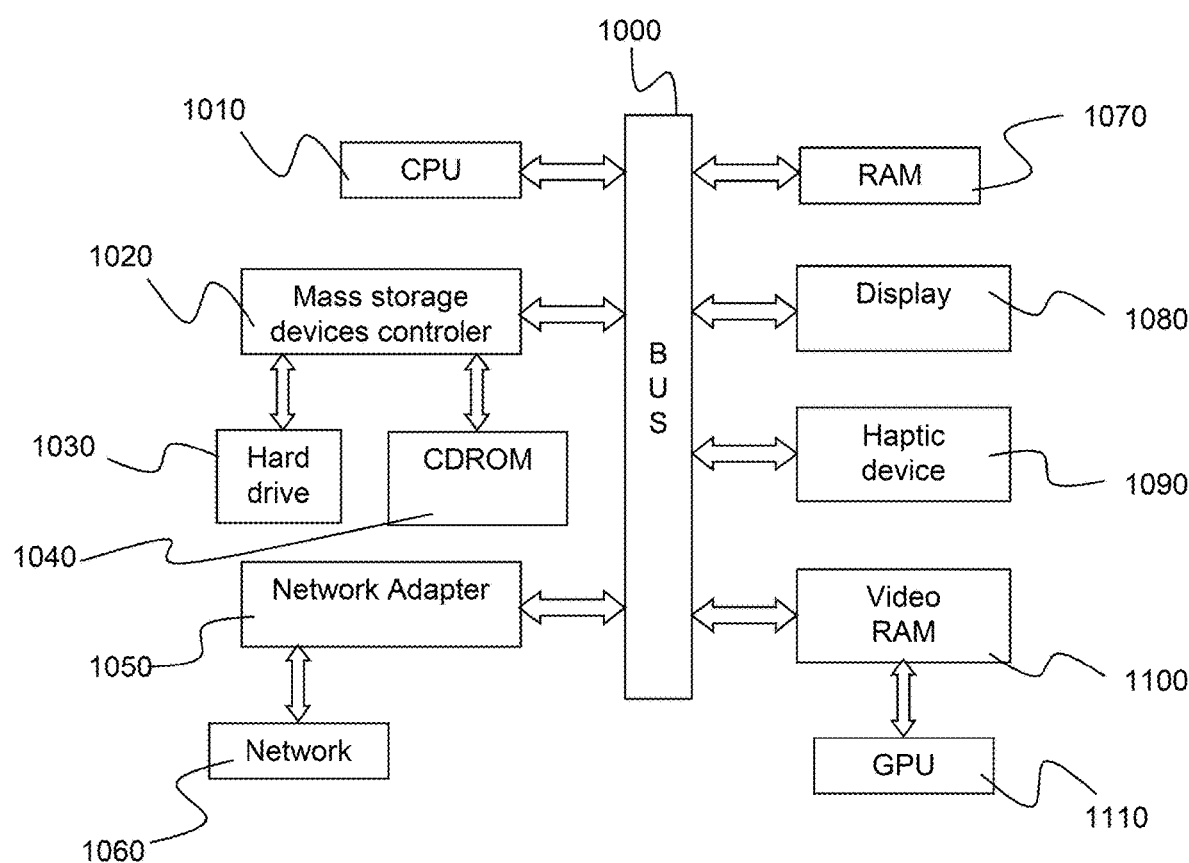
FIG. 6 illustrates an example of a computer of the embodiments.

FIG. 6 shows an example of the system, wherein the system is a client computer system, e.g. a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively, or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The system may be any combination of a CAD system, a CAE system, a CAM system, a PDM system and/or a PLM (Product Lifecycle Management) system. In those different systems, modeled objects are defined by corresponding data. A modeled object is any object defined by data stored e.g. in the database. By extension, the expression "modeled object" designates the data itself. According to the type of the system, the modeled objects may be defined by different kinds of data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

The method is for instancing a global physics simulation.

A physics simulation is any simulation from one or more field of physics, such as electronics, electricity, mechanics, electro-mechanics, fluid mechanics, gravitational mechanics, statistical mechanics, wave physics, statistical physics, particle systems, hydraulic systems, quantic physics, geophysics, astrophysics, chemistry, aerospatial, geomagnetism, electromagnetism, plasma physics or computational fluid dynamics (CFD). A physics simulation may be a multi-physics simulation that is a simulation involving at least two fields of physics. It may be the simulation of at least one behavior in time of any physics or multi-physics system from one or more fields of physics, including the above list of examples.

"Global" means that the global physics simulation comprises at least one local part, hereinafter called a local simulation that is a physics simulation that makes part of the global physics simulation, but that can be computed alone and independently of the global physics simulation. It can be understood that the global simulation may be a multi-physics simulation where each local part is a physics simulation from a respective field of physics. It can be understood that any local simulation may also be a multi-physics simulation. It is to be understood that the computation of the global simulation involves the computation of the local simulation and further computations. The further computations depend on the computation of the local simulations and the computation of the local simulations is not sufficient for performing the computation of the global computation.

A physics or multi-physics system is any real-world system or physical entity of which a behavior (e.g. in time) can be simulated via at least one physics model from at least one field of physics (such as one of the above examples of physics fields). A real-world system or physical entity may be a real-world object, an electronic product, an electrical product, a mechanical product, a chemical product, an electromechanical product, a system of particles or an electromagnetic product. A physics model may be an electronical model, an electrical model, a mechanical model, a statistical model, a particle model, a hydraulic model, a quantic model, a geological model, an astronomic model, a chemical model, an electromagnetic model or a fluid model. A physics model may be a system of one or more equations, such as one or more differential equations and/or partial differential equations and/or algebraic equations. A multi-physics system generally has sub-systems that are themselves physics or multi-physics systems and that are altogether connected by physics or logics relations, e.g. given by physics laws. A multi-physics system is thus a model to represent any real world system or any physical entity having sub-systems related together by physical or logical relations, such as mechanical relations (e.g. corresponding to connections for transmitting a force or movement), electrical relations (e.g. corresponding to electrical connections, for example in a circuit), hydraulic relations (e.g. corresponding to conducts that transmit fluxes), logical relations (e.g. corresponding to flows of information), fluid relations (e.g. corresponding to a fluid flow), chemical relations and/or electromagnetic relations. The system is called "multi-physics" because the physical or logical relations of a multi-physics system can belong to several fields of physics (although this is not necessary the case).

A physics or multi-physics system may correspond to an industrial product to be manufactured in the real world subsequent to the completion of its virtual design, such as a (e.g. mechanical) part or assembly of parts, or more generally any rigid body assembly (e.g. a mobile mechanism), rigid body mechanism. A CAD and/or CAE software solution allows the design of products in various and unlimited industrial fields, including: aerospace, architecture, construction, consumer goods, high-tech devices, industrial equipment, transportation, marine, and/or offshore or transportation. A physics or multi-physics system may thus represent an industrial product which may be a part (or the whole) of a terrestrial vehicle (including e.g. car and light truck equipment, racing cars, motorcycles, truck and motor equipment, trucks and buses, trains), a part (or the whole) of an air vehicle (including e.g. airframe equipment, aerospace equipment, propulsion equipment, defense products, airline equipment, space equipment), a part (or the whole) of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging). The global physics simulation may be the simulation of a behavior of at least one industrial product to be manufactured in the real-world, of which design has already been performed. The simulation may simulate at least one behavior (e.g. an evolution in time) of the at least one industrial product subsequent to its design. The method may be followed by the manufacturing in the real-world of the at least one industrial product subsequent to its simulation by the method.

Simulating a physics or multi-physics system modelized by at least one physics model generally comprises computing an approximation of a physical behavior in time (e.g. an evolution in time) of the system by computing the at least one physics model and/or storing the results and/or displaying the results. Computing the at least one physics model may be preceded by the providing of at least one grid (or mesh) and/or at least one time step and/or at least one simulation parameter. Said providing may be carried out upon user action. The computing generally (but not always) includes discretizing the one or more equations of the at least one physics model according to the at least one grid and/or the at least one time step. The discretizing may be done by using any known numerical method.

A physics simulation, global or local, comprises simulation states (which may be referred to as "states" in the following, for the sake of simplicity). A state is a representation, at a given time, of a physics state of a physics system of which a behavior (e.g. in time) is simulated by the simulation. For instance, a physics state may be any physical quantity at a given time. A physics quantity (also referred to as physical quantity) is a physical property of a phenomenon, body, or substance that can be quantified by measurement. A physical quantity may be, but is not limited to, Length, Mass, Time, Electric current, Temperature, Amount of substance, Luminous intensity, Absement, Absorbed dose rate, Acceleration, Angular acceleration, Angular momentum, Angular speed (or angular velocity), Area, Area density, Capacitance, Catalytic activity, Catalytic activity concentration, Chemical potential, Crackle, Current density, Dose equivalent, Dynamic viscosity, Electric charge, Electric charge density, Electric displacement, Electric field strength, Electrical conductance, Electrical conductivity, Electric potential, Electrical resistance, Electrical resistivity, Energy, Energy density, Entropy, Force, Frequency, Fuel efficiency, Half-life, Heat, Heat capacity, Heat flux density, Illuminance, Impedance, Impulse, Inductance, Irradiance, Intensity, Jerk, Jounce (or snap), Kinematic viscosity, Linear density, Luminous flux (or luminous power), Mach number (or mach), Magnetic field strength, Magnetic flux, Magnetic flux density, Magnetization, Mass fraction, (Mass) Density (or volume density), Mean lifetime, Molar concentration, Molar energy, Molar entropy, Molar heat capacity, Moment of inertia, Momentum, Permeability, Permittivity, Plane angle, Power, Pressure, Pop, (Radioactive) Activity, (Radioactive) Dose, Radiance, Radiant intensity, Reaction rate, Refractive index, Reluctance, Solid angle, Speed, Specific energy, Specific heat capacity, Specific volume, Spin, Strain, Stress, Surface tension, Temperature gradient, Thermal conductivity, Torque, Velocity, Volume, Volumetric flow, Wavelength, Wavenumber, Wavevector, Weight, Work, Young's modulus. A state may also be a vector of physical quantities. A physics simulation typically comprises an initial time and a final time, and at least one time step that is/are comprised between the initial time and the final time. There is one state for each time step, including the initial time and the final time.

Computing a physics simulation means that all simulation results are computed, a simulation result being data containing information representing a state. Thus, computing a simulation means that substantially all the information representing all states at all times is computed. A simulation of the approach may be computed by using any known numerical method and/or any existing computer program that is able to export and/or display simulation results at different time steps.

The method comprises providing S10 a set of local simulations.

Each local simulation of the set of local simulations is already computed. In examples, the providing S10 includes loading and/or accessing (e.g. in a database) the set of already computed local simulations. Providing S10 thus means that data of the set of local simulations is made available to the system that performs the method, e.g. they are loaded in a memory of the system (e.g. a volatile memory) or can be retrieved by the system from a memory (e/g/ a non-volatile memory. In examples, the providing S10 may be preceded by the computing of each local simulation of the set and the storing of the results of the computations in a database. In all cases, at the providing S10, all local simulations of the set are already computed, which means that all simulation results of all local simulations are available, e.g. can be used to run and/or display the local simulations and/or compute their respective reduced models. The set of local simulations comprises at least one local simulation.

Each local simulation is a physics simulation that is part of the global physics simulation and that can be computed alone and independently of the global physics simulation. As already said, the local simulations are not sufficient for performing the computation of the global computation. As also already said, computation of the global physics simulation requires computations of the local simulations.

A local simulation is part of the global physics simulation when computing the global physics simulation requires using results and/or data derived from results obtained during the computing of the local simulation. A local simulation can be computed alone and independently of the global physics simulation when computing the local simulation does not require using any results and/or any data derived from results obtained during the computing of the global physics simulation. In other words, each local simulation represents an independent sub-simulation (or a local part) of the global physics simulation. In examples, a local simulation is part of the global physics simulation when the local simulation is modelized by at least one physics model that is also used to model the global physics simulation. In these examples, it is meant by "computed alone and independently" that the at least one physics model can be solved and/or discretized and/or approximated and/or computed without solving and/or discretizing and/or approximating other physics models intervening in the modelling of the global physics simulation. In other words, the at least one physics model is self-consistent and/or self-sufficient to run and/or compute the local simulation. In these examples, there may be at least one other physics model that intervenes in the modelling of the global physics simulation and that takes as input and/or parameter results and/or data derived from results of the solving and/or the discretizing and/or the approximating of said at least one physics model.

For the sake of illustrating the definitions of local and global simulations, a non-limiting example is now given. It is the example of the simulation of an aircraft wing with at least one aircraft engine attached to the wing. The global physics simulation is the whole behavior of the assembly formed by the wing and the at least one engine in given flight conditions. Each local simulation simulates the behavior of one engine alone in given flight conditions. Computing the simulation of whole behavior of the assembly formed by the wing and the at least one engine requires to compute the simulation of the behavior of each engine attached to the wing. However, computing one simulation of one behavior of one engine can be done without simulating the whole assembly.

The method comprises, for each local simulation of the set of local simulations, computing (S30) a respective reduced model of the local simulation.

A reduced model of a computed simulation is a model computed from the simulation by using Reduced Order Modeling techniques. Reduced order Modeling (ROM) techniques are techniques that reduce the dimensionality and computational complexity of mathematical models. A ROM (hereinafter, reduced model) is built from high-fidelity simulations (e.g. computed full simulations) and can subsequently be used to generate simulations for lower computation. One example of ROM methods is Galerkin projection (see for instance Rowley, Clarence W., Tim Colonius, and Richard M. Murray. "Model reduction for compressible flows using POD and Galerkin projection." Physica D: Nonlinear Phenomena 189.1-2 (2004): 115-129. and Barone, Matthew F., et al. "Reduced order modeling of fluid/structure interaction." Sandia National Laboratories Report, SAND No 7189 (2009): 44-72), which is particularly popular for fluid dynamics. The Galerkin projection method uses Proper Orthogonal Decomposition (POD) to reduce the dimensionality of flow simulations and then finds the dynamics on this reduced space. There are other methods that build on this such as reduced basis methods and balanced truncation (see for instance Veroy, K., and A. T. Patera. "Certified real-time solution of the parametrized steady incompressible Navier-Stokes equations: rigorous reduced-basis a posteriori error bounds." International Journal for Numerical Methods in Fluids 47.8-9 (2005): 773-788. And Rowley, Clarence W. "Model reduction for fluids, using balanced proper orthogonal decomposition." Modeling And Computations In Dynamical Systems: In Commemoration of the 100th Anniversary of the Birth of John von Neumann. 2006. 301-317). Generally speaking, ROM computes, from states of a computed full simulation, a basis that represents the main components of the simulation, using techniques such as POD or Single Value Decomposition (SVD). The SVD provides a way to factorize a matrix into singular vectors and singular values. The SVD allows discovery of some of the same kind of information as the eigen decomposition and can for instance represent the main components of a mechanical system. Also known is "Model Order Reduction", Francisco Chinesta, Antonio Huerta, Gianluigi Rozza and Karen Willcox, Encyclopedia of Computational Mechanics, edited by Erwin Stein, Rene de Borst and Thomas J. R. Hughes, 2004. The computing of a reduced model according to the method uses any techniques of ROM, such as the ones described in the references hereabove. The reduced model of a simulation of the approach may also be called a surrogate model of the simulation.

Each respective computed reduced model of each computed local simulation comprises a basis with elements. These elements of the basis may be called basis elements hereinafter. A basis element is a component of the factorization computed from the computed local simulation data. A basis element may also be called a state mode. In examples, the basis elements are energy modes of a physics system simulated by the local simulation. Each state of the local simulation can be generated at any time by a linear combination of a finite number of state modes. The linear combination approximates the state and may be called a reduced state.

The basis may be written $B=(e_1; e_2; \ldots; e_n)$, where the $e_i$ are the basis elements. Any state state(t) can be approximated at time t by its reduced state PState(t) that is a linear combination of these basis elements as follows:

$$PState(t)=w_1(t)*e_1+w_2(t)*e_2+\ldots+w_n(t)*e_n \qquad \text{(formula (1))}.$$

Here, the $w_i$ are the weights of the contribution of each basis elements used to compute the reduced state PState(t). The basis B is kept constant over time, and only the weights may evolve in time. Updating the weights in time makes the simulation results advance in time. Computing the reduced model of a simulation includes computing all elements of the basis B and all weights at all times t that are time steps comprised between the initial time and the final time of the simulation. Thus, once the reduced model is computed, any reduced state PState(t) representing any state state(t) of the computed simulation at any time step t is available, by using formula (1).

Figure 14:
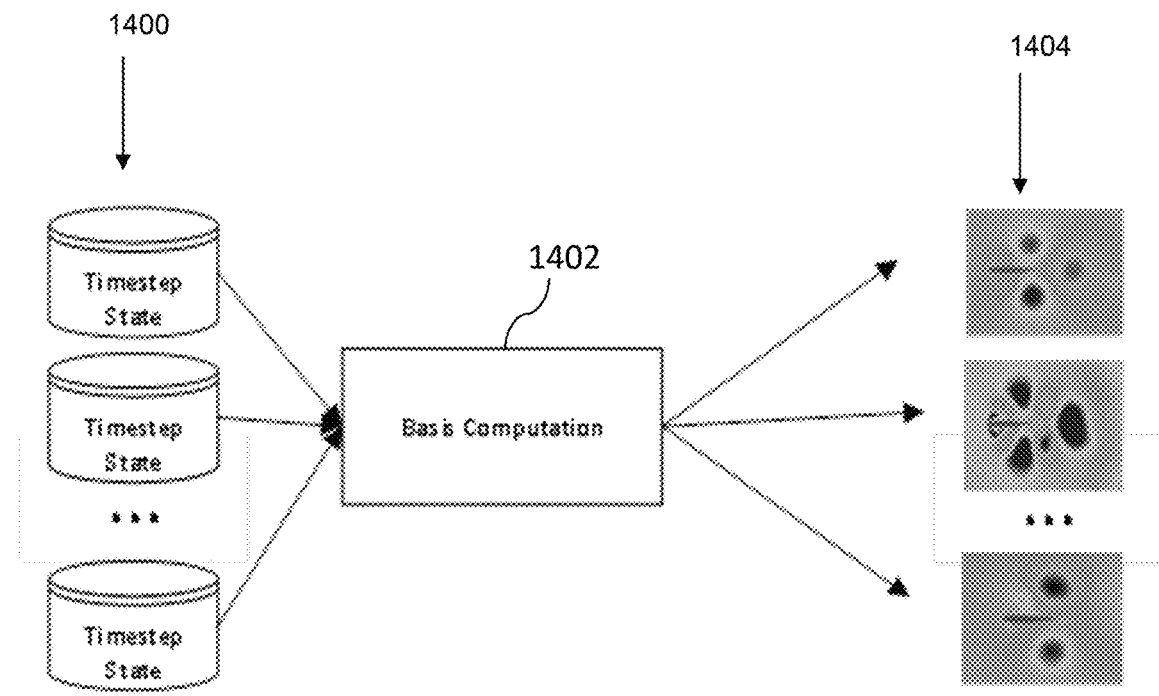
FIG. 14 shows a diagram illustrating an example of the computing of the reduced model.
Figure 15:
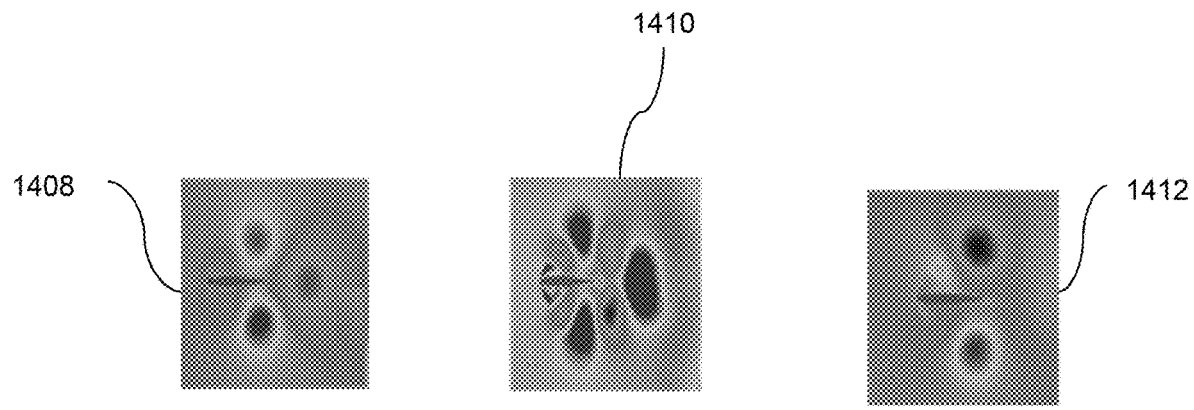
FIG. 15 shows examples of basis elements.

FIG. 14 is a diagram illustrating an example of the computation of the reduced model. The computation takes as inputs the states 1400 of the computed full simulation at all time steps of the full simulation. The computation includes the computation 1402 of the basis, which is based on all the states 1400 of the computed full simulation. In the example of FIG. 14, the computed basis is a basis of snapshots 1404 of the computed full simulation. In other words, the basis elements are in this example snapshots of the computed full simulation. Three screenshots of snapshots 1408, 1410 and 1412 are illustrated in FIG. 15.

The method comprises computing S2 each global simulation of a set of at least one global simulation. Each global simulation is an instance of the global physics simulation. It means that each global simulation pertains to simulate the same physics than the global physics simulation, but with at least one difference between each global simulation. In other words, each global simulation represents a different example the global physics simulation. In examples, there is at least one change (e.g. a slight or substantial change) between each global simulation, which may be a change of at least one simulation parameter such as a mesh discretization step, a time step, the size of a simulation domain, a boundary condition or a physical parameter. In examples, all instances of the global physics simulation are modelized substantially by the same physics model(s). Generally speaking, the expression "instance of a simulation" means a concrete occurrence of the simulation, so that the system performing the method owns an example of the simulation.

A non-limiting example illustrating the meaning of "Each global simulation is an instance of the global physics simulation" is the example of computing simulation instances of a simulation of an aircraft wing with at least one aircraft engine attached to the wing. The global physics simulation pertains to simulate the physics of an aircraft wing with at least one aircraft engine attached to the wing in condition of flights. Each global simulation pertains to simulate the same physics, but for instance, the wing shape (or profile) is different from a global simulation to another.

The computing S2 of each global simulation comprises reusing S220 each respective computed reduced model of each local simulation of at least one local simulation.

Reusing S220 a computed reduced model of a local simulation during the computing S2 of a global simulation comprises using, in the computations, one or more reduced states of the computed reduced model of the local simulation and/or data derived from one or more reduced states of the computed reduced model of the local simulation. In examples, simulation states of the at least one local simulation and/or data derived from these simulation states may normally form input(s) and/or parameter(s) and/or boundary condition(s) of one or more physics models that intervene in the modelling of the global physics simulation (and thus of each global simulation), e.g. at different time steps. In these examples, reusing S220 each respective computed reduced model of each local simulation of at least one local simulation means that reduced states of the at least one local simulation and/or data derived from these reduced states replace the simulation states and/or the data derived from these simulation states when forming input(s) and/or parameter(s) of said one or more physics models. In examples, the at least one local simulation comprises multiple exemplars of a same local simulation.

It is to be understood that, although each local simulation of the set of local simulations is a part of the global physics simulation, the computing S2 of each global simulation does not necessarily comprise reusing all respective computed reduced models of all local simulations. In other words, during the computing S2 of each global simulation, there may be independent local parts of the global physics simulation that are still computed without being replaced by a respective reduced model of a corresponding local simulation. However, there is at least one independent local part (corresponding to the at least one local simulation instance, which may be selected, e.g. upon user action) that is replaced by a respective reduced model.

In examples, each local simulation is associated with a respective local domain and each global simulation is associated with a respective global domain. In these examples, the method further comprises, before the computing S30 of each respective reduced model of each local simulation, selecting S20 a respective zone of interest of the local simulation. The respective zone of interest is a non-empty sub-domain of the respective local domain. At the computing S30 of each respective reduced model of each local simulation, each respective reduced model of each local simulation is computed at the border of the respective zone of interest. At the computing S2 of each global simulation, the method further comprises placing S210 the respective zone of interest of each local simulation of the at least one local simulation in the respective global domain of the global simulation. Only the remaining part of the global domain is computed. The remaining part is the part of the local domain that is occupied by no zone of interest. The global domain comprises regions that are respectively occupied by each respective zone of interest of each local simulation of the at least one local simulation.

A simulation domain is typically meshed or discretized. A simulation domain is a zone of interest for the simulation in the environment of the simulation. For some physics simulations (e.g. large scale physics simulation), the meshing of the simulation domain may be tricky, and multiscale issues may be encounter and solved. Multiscale issues typically refer to the case where local parts of the simulation domain need to be meshed at different scales, e.g. with different space discretization, than other parts of the simulation domain. Typically, the global physics simulation (thus each global simulation) may require a certain meshing of each respective global domain, and each local simulation of the set of local simulations may require (e.g. respectively) a different meshing of each respective local domain. One must then compute the global physics simulation and/or adapt the physics modelling according to these different meshes. As a result, instancing the global physics simulation may be costlier in terms of time and/or resources of computation. The present approach circumvents these difficulties, because each part of each global domain which is occupied by a respective zone of interest is not computed. The computed respective reduced models at the borders of these zones of interest are reused, and thus only the meshing of the remaining part of the respective global domain is involved in the computing S2 of each global simulation. The present approach thus avoids or significantly reduces multiscale issues.

In the embodiments, a domain (resp. a sub-domain) is a domain (resp. sub-domain) in its mathematical meaning. The border of a domain (resp. a sub-domain) is also to be understood in its mathematical meaning. The domains of the present approach may be two-dimensional or three-dimensional domains. The local and global domains are simulation domains. A simulation domain is a domain that models a real-world physical region in which the physics phenomenon(s) to which the simulation pertains occur(s). Saying that a simulation is associated with a domain means that the domain is a simulation domain of the simulation. In examples, each respective local domain and each respective global domain are respectively meshed. The meshing may be performed upon user action, e.g. at an initial stage of the method. In examples, all global domains are identical. In examples, all global domains model the same real-world physical region. In examples, each respective local domain respectively corresponds to (e.g. is equal to, is identical to) a respective sub-domain of each global domain (that is, common to each global domain). In these examples, each respective local domain may model the same real-world physical region as said respective sub-domain common to each global domain that is a respective sub-region of the real-world physical region modelized by each global domain.

A non-limiting example illustrating the definitions of global and local domains is now discussed. The example relates to the previously discussed example of the at least one aircraft engine attached to an airplane wing. Each global domain is a three-dimensional volume modelling the air surrounding the wing in flight conditions. Each local domain is a three-dimensional volume encompassing a part (e.g. the totality) of one aircraft engine and air surrounding the aircraft engine, and possibly, the mechanical links attaching the engine to the wing.

The selecting S20 of the respective zone of interest, also called region of interest, of a local simulation may be performed automatically. In this case, said selecting S20 may be performed to fulfill one or two of the following criteria:

"Variations of scalar values on the respective local domain": in this case, since all simulation results and states of the computed local simulation are known, the method may, based on these results and states, compute and/or identify the variations of one or more scalar values related to the local simulation on the respective local domain, such as variations of an energy and/or exchanges of energy. The method may then automatically select the zone of interest according to these variations, for instance by selecting as zone of interest the smaller box in which all (or a predetermined significant part of) the variations are larger than a predetermined threshold and/or smaller than a predetermined maximum. The variations of the one or more scalar values may be computed from the state modes, e.g. from the energy modes when computing the variations of the energy or energy exchanges. Such criterion selects the respective zone of interest as the part of the respective local domain in which the essential part of a given physics phenomenon (e.g. energy exchanges) occur. The predetermined threshold and/or the predetermined maximum may be chosen upon user action, e.g. at an initial stage of the method.

"Smaller box around a solid": in this case, the local simulation simulates a physics phenomenon in which a solid such as a physical object or product is involved. The respective local domain typically encompasses a representation (e.g. geometrical) of the solid, and the method then automatically selects S20 as the respective zone of interest the smaller box encompassing the representation.

The selecting S20 of the respective zone of interest of a local simulation may also typically be performed to fulfill any plausible combination of the above criteria. The method may for instance select the respective zone of interest such that the latter encompasses both a solid comprised in the local domain and significant variations of a scalar (e.g. a physical quantity such as an energy) around the solid. Additionally, the method may automatically prevent the selected respective zone of interest to be empty and/or too large (e.g. larger than the respective local domain and/or larger than any respective global domain).

In examples, the selecting S20 of the respective zone of interest of a local simulation may be performed upon user action. In these examples, it may be automatically forbidden to the user to select an empty and/or too large sub-domain. In examples, each local simulation may be displayed to the user, e.g. on a GUI, the user performing the selecting S20 by interacting (e.g. with a touch or a haptic device) with the GUI to select each zone of interest on each displayed local simulation.

Figure 9:
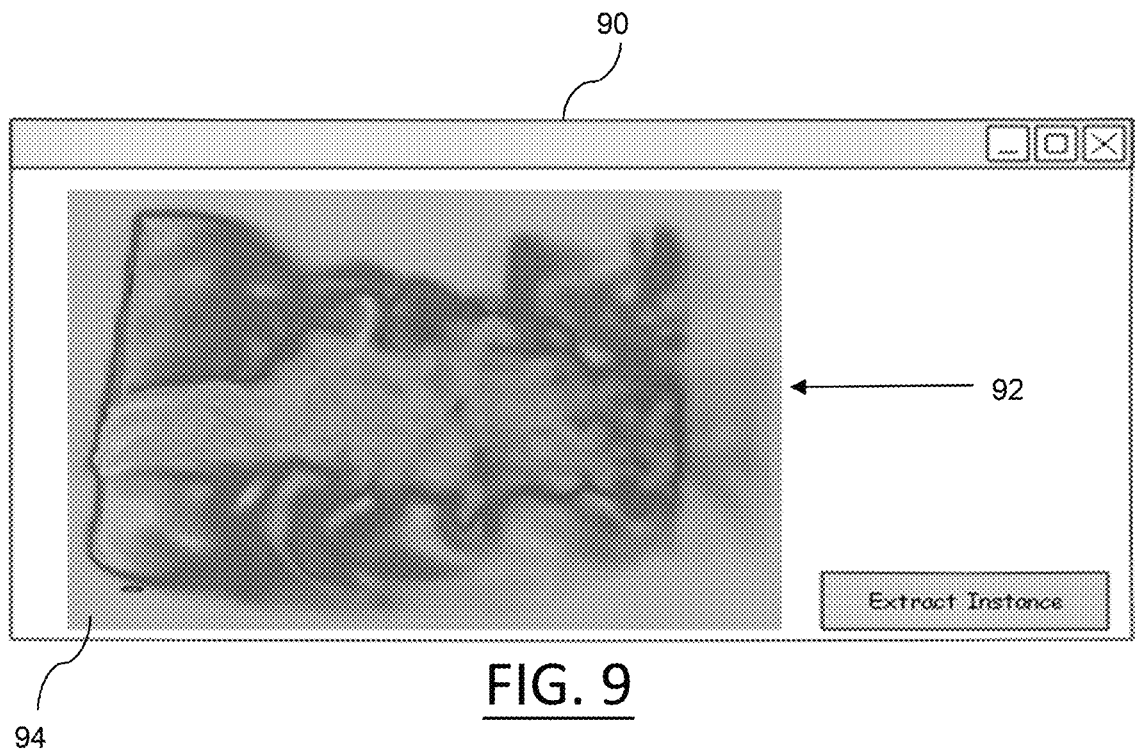
FIGS. 9-10 shows screenshots illustrating an example of the selecting of a respective zone of interest.
Figure 10:
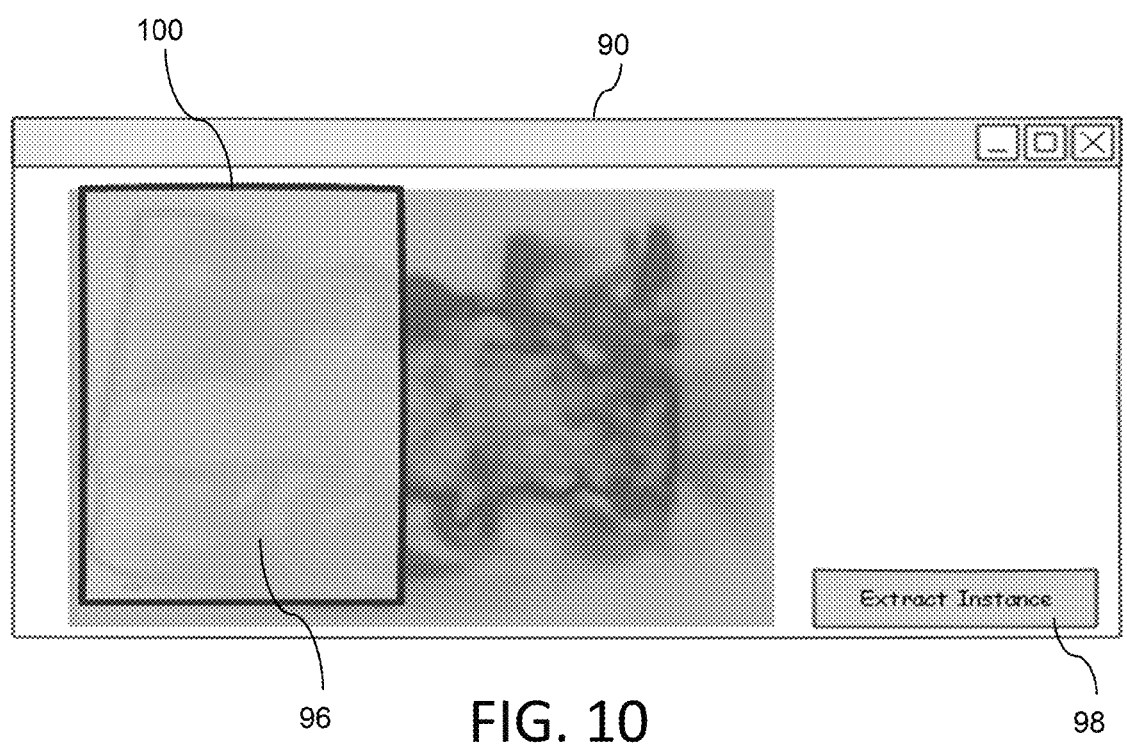

An example of the selecting S20 upon user action of a respective zone of interest is now described with reference to FIG. 9 and FIG. 10. The user loads S10 a local simulation 92. The local simulation 92 is displayed with its respective local domain 94 in a window 90 of a GUI. Although FIGS. 9 and 10 are screenshots, it is to be understood that it may be a video, e.g. of the local simulation progressing in time, that is displayed within the window 90. By using a haptic device or a touch, the user forms the respective zone of interest 96 he/she wishes to select within the respective local domain 94. The polyline 100 represents the border of the respective zone of interest 96. The user may form the respective zone of interest 96 by forming its border, here the polyline 100.

In examples, each respective reduced model of each local simulation is computed S30 at the border of the respective zone of interest. Computing S30 a respective reduced model at the border of a respective zone of interest comprises computing the reduced states of the corresponding local simulation on or substantially on the border of the respective zone of interest. For example, all reduced states of the corresponding local simulation may be computed, but only those on or substantially on the border of the respective zone of interest may be kept. Reduced states in the interior of the respective zone of interest are in such cases not kept. Reduced states computed at the border of a respective zone of interest occupying a region of a respective global domain suffice to compute S2 the corresponding global simulation at the interface between the region occupied by the respective zone of interest and the remaining part of the respective global domain. This allows to simulate and/or compute the remaining part without recomputing the occupied region. In examples, it is indeed sufficient, in order to model and/or simulate and/or approximate and/or compute communications and/or interfacings and/or exchanges between occupied regions and the remaining part of the global domain, to use reduced states computed at the border of the occupied regions in the computations.

Placing S210, at the computing (S2) of each global simulation, a respective zone of interest in a respective global domain comprises replacing a region of the respective global domain by the respective zone of interest. The placing S210 may be performed upon user action. In examples, the respective zone of interest is displayed, e.g. on a GUI, and the user moves (or displaces) the respective zone of interest in the global domain which is also displayed nearby. The move of the respective zone of interest may be performed by interacting with the GUI, e.g. using a touch or a haptic device. For instance, the user performs a drag and drop operation, as known in the art. Upon the respective zone of interest being moved into the respective global domain, the method may automatically replace the region of the respective global domain on which the respective zone of interest has been moved by the respective zone of interest. In case several respective zones of interest are placed during the placing S210 of respective zones of interest, the method may automatically prevent any overlapping of zones of interest. In examples, the user enters, e.g. by using a keyboard, where the respective zone of interest is to be placed in the global domain.

Figure 11:
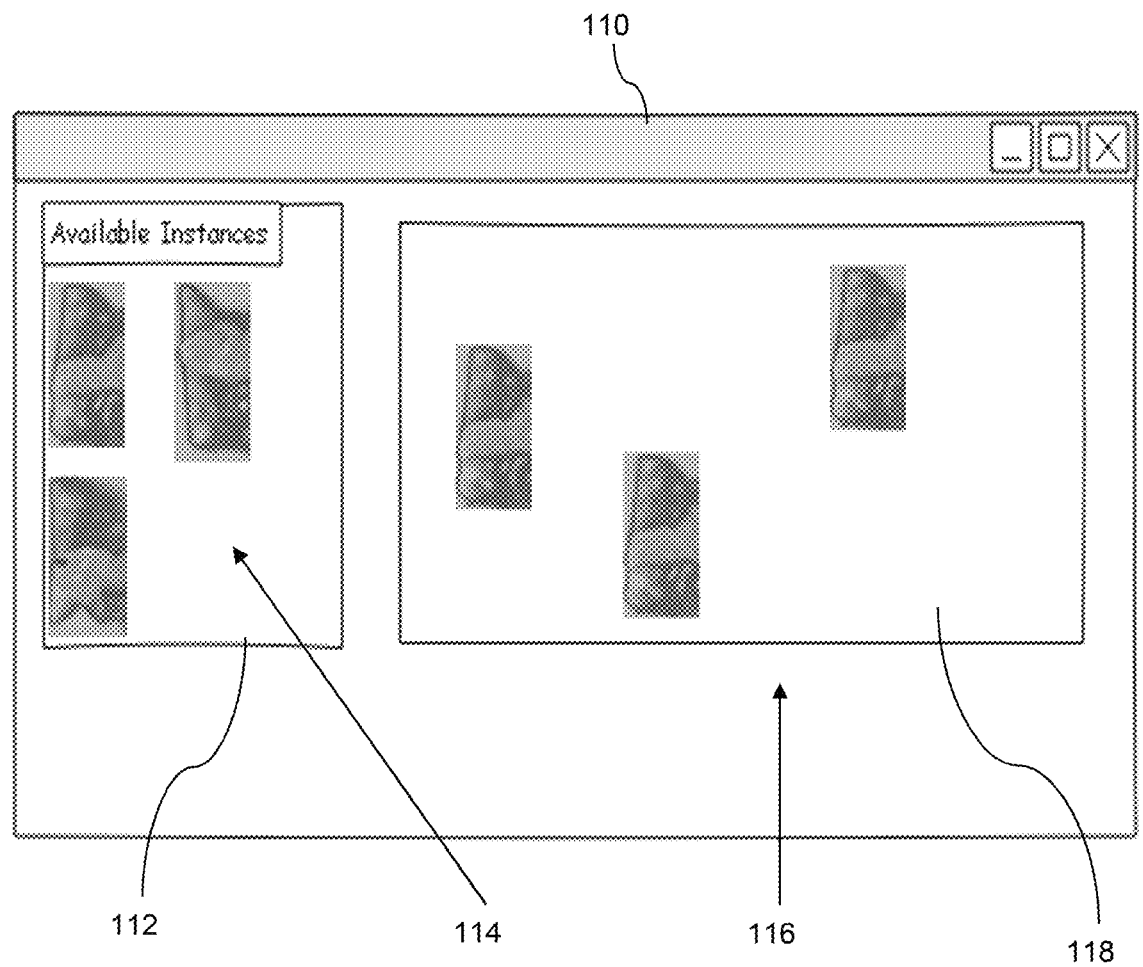
FIG. 11 shows a screenshot illustrating an example of placing respective zones of interest.

It is now discussed an example of the placing S210 of respective zones of interest with reference to FIG. 11. In this example, a window 110 is displayed to the user, e.g. on a GUI. A frame 112 within the window 110 comprises three previously selected respective zones of interest 114 of three local simulations. One of the respective zones of interest may be the respective zone of interest 96 of FIG. 10. Although FIG. 11 is a screenshot, it is to be understood that it may be videos, e.g. of each respective zone of interest of each local simulation progressing in time, that are displayed within the window 110. The user moves each respective zone of interest he wishes to place in the respective global domain 118 of a global simulation 116, the respective global domain being displayed within the window 110, and thereby places the respective zone of interests where he/she desires. One respective zone of interest may be moved multiple times. The remaining part, that is the part of the global domain 118 occupied by no respective zone of interest, is the only part of the respective global domain 118 that is computed at the computing S2 of the global simulation.

By "only the remaining part of each respective global domain is computed" it is meant that only simulation states and/or results of the respective global simulation in the remaining part are computed.

In examples, the method comprises, at the placing S210 of the respective zone of interest of each local simulation of the at least one local simulation, interfacing the border of the respective zone of interest with the border of the region of the respective global domain occupied by the respective zone of interest.

In examples, the interfacing may comprise a modification or a series of modifications of at least one algorithm and/or numerical method pertaining to the computing S2 of the global simulation associated with the respective global domain. The interfacing incorporates the respective zone of interest and the respective computed reduced model computed at the border of the respective zone of interest in the at least one algorithm and/or numerical method, thereby allowing the computation of the global simulation by reusing the respective reduced model. The modification or the series of modifications may be performed automatically, e.g. upon the user dragging the respective zone of interest in the respective global domain. The modification or the series of modifications may also be performed upon user action, e.g. by interacting with a keyboard and/or a haptic device.

An implementation of the interfacing is now discussed with reference to FIG. 16.

Figure 16:
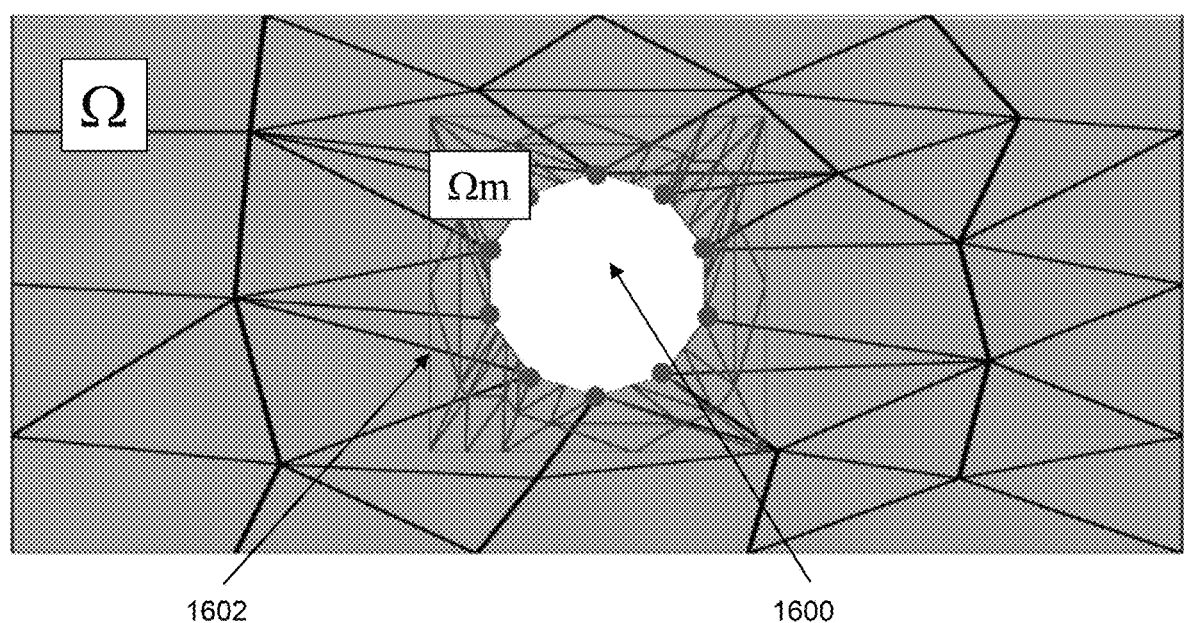
FIG. 16 illustrates an implementation of the interfacing.

FIG. 16 shows the global domain C) of the global simulation and the local domain $\Omega m$ of a local simulation of the at least one local simulation. In this implementation, the global domain $\Omega$ and the local domain $\Omega m$ are respectively (e.g. differently) discretized. FIG. 16. shows the respective zone of interest 1600 of the local domain $\Omega m$, illustrated by the white area. In this implementation, the local domain $\Omega m$ comprises a recovery area 1602, which is the region of the local domain $\Omega m$ not occupied by the zone of interest 1600.

In this implementation, the interfacing is based on correspondence points of the discretization of $\Omega$ with the zone of interest 1600. The correspondence points are points located at or substantially at the border of the zone of interest 1600. The correspondence points are illustrated as bullet points one FIG. 16. This is only an illustration, for the sake of clarity, but the correspondence points are not necessarily bullet points. In this implementation, reduced states of the local simulation are computed on or substantially on the correspondence points and on or substantially on the recovery area 1602. The interfacing then comprises verifying a coherence between the reduced states computed on or substantially on the correspondence points and the reduced states computed on or substantially on the recovery area 1602. Verifying a coherence may comprise determining whether physical quantities (such as an energy or a displacement) of the reduced states computed on or substantially on the correspondence points and physical quantities of the reduced states computed on or substantially on the recovery area 1602 are homogeneous or not. When it is determined that the physical quantities are homogeneous, then the interfacing may incorporate the zone of interest 1600 and the computed reduced model computed at the correspondence points in the at least one algorithm and/or numerical method, as previously discussed.

Alternative implementations do not use the recovery area 1602. In these alternative implementations, the interfacing does not comprise the verifying of the coherence. In these alternative implementations, the interfacing may directly incorporate the zone of interest 1600 and the computed reduced model computed at the correspondence points in the at least one algorithm and/or numerical method, as previously discussed.

In examples, each local domain of each local simulation comprises a respective physical object. The local simulation simulates a respective physical behavior associated with the respective physical object. In these examples, each global simulation simulates a respective scenario of a common physical behavior associated with all respective physical objects of each local simulation of the at least one local simulation. The common physical behavior is common to all global simulations.

A physical object, in the meaning of the embodiments, is a product or an assembly of products or a real world physical entity. A physical behavior associated with an object may be a behavior of the object itself or a behavior of the object in an environment surrounding the object (e.g. a real-world environment) or a behavior of the object in interaction with the environment. A common physical behavior associated with several objects is a behavior of said several objects together, e.g. in the same environment (e.g. a real-world environment). In may include interactions between the objects and/or with the environment. The common physical behavior, in the meaning of the embodiments, is common to all global simulations, which means that all global simulations pertain to simulate the one common physical behavior. Each global simulation simulates in fact a respective scenario of the common physical behavior. By this it is meant that two scenarios differ in that at least one physical parameter or physical entity pertaining to the global physics simulation differ (e.g. slightly or substantially) from one scenario to the other, even if the scenarios represent one common physical behavior.

It is provided below a table containing a list of non-limiting examples of global physics simulations, physical objects, physical behaviors and scenarios. The method may contemplate the instancing of one or more of the examples of global physics simulation given in the table below.

with one or more difference (e.g. slight or substantial difference) between the representations. A difference may be a difference of size, shape, profile, material composition, chemical composition or a physical property such as a mechanical, chemical, electromagnetic, electrical, hydraulic, engineering and/or design property. The common physical object is common to all global simulations in that all global simulations pertain to a physical behavior, namely the common physical behavior, of the common object in a (e.g. real-world) environment. The common behavior is a physical behavior of the common physical object relatively to all respective physical objects, such as: interactions between all

TABLE 1 examples of global physics simulations

| Global physics simulation | Respective physical object | Respective physical behavior | Common physical behavior | Respective scenario |
|---|---|---|---|---|
| Fluid Simulation | One of the wind turbines | The wind turbine working in given wind conditions | All wind turbines working together in the wind farm | Changing the wind conditions in the wind farm/and or the size of the wind farm and/or positions of wind turbines. |
| Electromagnetism | Antenna | Antenna emitting signals | Global coverage of antenna within an area | Changing antenna position and emitting power |
| Heat Transfer | Heater | Heat source | Heat Analysis in a building | Optimize heat map of a building |
| Structural analysis | Brick | Brick under load analysis | Wall of bricks simulation | Modifying brick geometry and material properties |

In examples, for each global simulation, the respective global domain of the global simulation comprises a respective variation of a common physical object. The common physical object is common to all global simulations. In these examples, the common physical behavior associated with all respective physical objects of each local simulation of the at least one local simulation is a physical behavior of the common physical object relatively to all respective physical objects of each local simulation of the at least one local simulation.

By variation of a physical object, it is meant the following: two variations represent the same physical objects, but said objects and/or their environment, an assembly (e.g. mechanical assembly) of all said objects and possibly the interactions of the assembly with its environment, a movement of all said objects together in interaction with their environment.

It is provided below a table containing a list of non-limiting examples of global physics simulations, physical objects, physical behaviors, variations and scenarios. The method may contemplate the instancing of one or more of the examples of global physics simulation given in the table below.

TABLE 2

Other examples of global physics simulations

| Global physics simulation | Respective physical object | Respective physical behavior | Common physical object | Respective variation | Common physical behavior | Respective scenario |
|---|---|---|---|---|---|---|
| An assembly of an aircraft wing with one engine | The engine | The engine working in given weather conditions | The wing | Changing the shape and/or the size/and or a physical property of the wing | The assembly in conditions of flight and/or take off and/or landing | Effects of the respective variation and/or effects of changes of weather conditions |
| An assembly of electromagnet rings to | One of the electromagnet rings | The electromagnetic ring working at different | The tokamak thermonuclear fusion power | Changing the shape and/or size of the | The assembly in conditions of production an electromagnetic | Effects of the respective variation |

TABLE 2-continued

Other examples of global physics simulations

| Global physics simulation | Respective physical object | Respective physical behavior | Common physical object | Respective variation | Common physical behavior | Respective scenario |
|---|---|---|---|---|---|---|
| enable plasma fusion confinement | | current levels, and the transition between them | | ring | fields to confine the nuclear fusion | and/or effects of changes of current levels and shapes |
| Antenna coverage from a building | A radio antenna | The antenna emitting from a given building | The antenna | Changing the building shape and height | The antenna being able to emit with a good coverage in a city | Effect of the respective variation of the building properties in the coverage of the antenna |
| An assembly of motorbike with tires | Bike tires | The behavior of the tires on the road | The tire | Changing the bike frame shape and weight balance | The assembly in condition of riding | The stability and the deformation of the tire |

In examples, the set of local simulations consists in exactly one local simulation.

In examples, the set of at least one global simulation comprises at least two global simulations.

Figure 7:
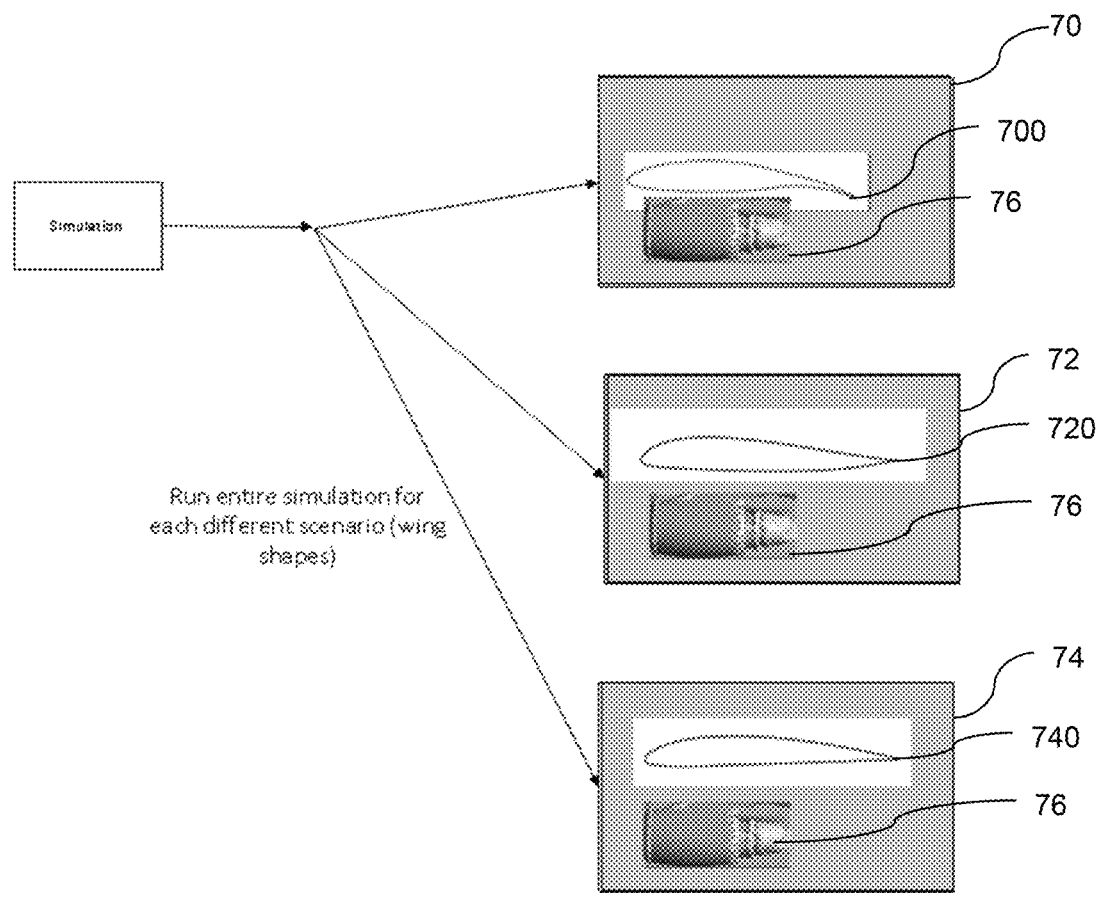
FIG. 7 illustrates an example of instancing a simulation according to a method of the prior art.
Figure 8:
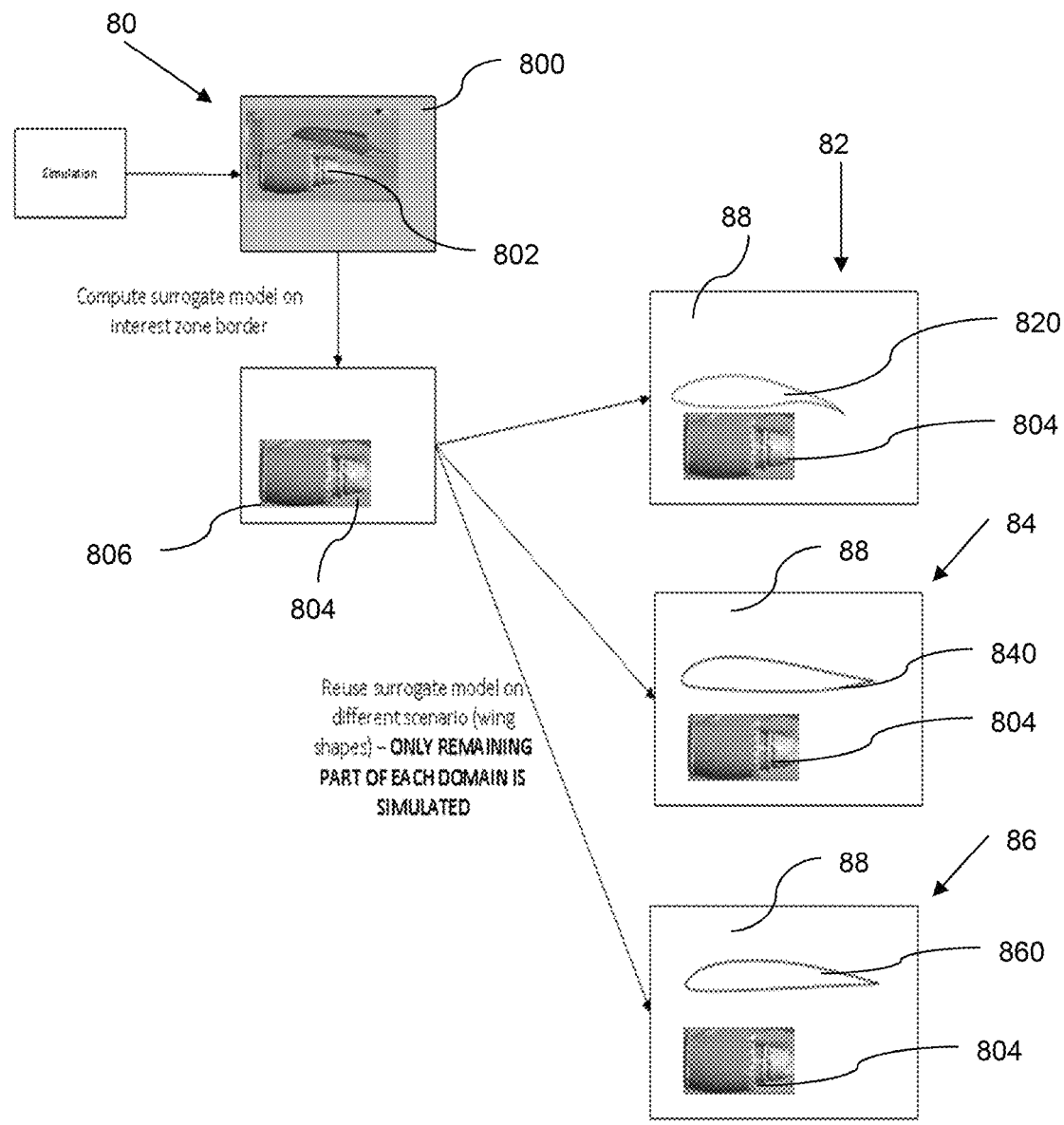
FIG. 8 illustrates an example of instancing a simulation, where the set of local simulations comprises exactly one local simulation, according to the method.

With reference to FIG. 7 and FIG. 8, it is now discussed a comparison between an example of instancing a simulation according to a method of the prior art as shown in FIG. 7 and an example of instancing a simulation according to the method of the embodiments, where the set of local simulations comprises exactly one local simulation as shown in FIG. 8. In both examples, one needs to simulate one given aircraft engine attached to three different wing profiles.

In the example of the priori art in FIG. 7, one needs to fully run a first simulation 70 of the aircraft engine 76 attached to a first wing profile 700, a second simulation 72 of the aircraft engine 76 attached to a second wing profile 720 and a third simulation 74 of the aircraft engine 76 attached to a third wing profile 740. In other words, one runs independently simulations of every configuration of the engine attached to the wing.

In the example of the embodiments in FIG. 8, it is first provided S10 a set of one already computed local simulation 80 simulating an aircraft engine 802 running in given weather conditions. The local simulation 80 may be a multi-physics simulation involving mechanical (e.g. structural) and CDF models. The local simulation is associated with a respective local domain 800. The method selects S20 a respective zone of interest 804 of the respective local domain. Here, the selecting S20 of the respective zone of interest 804 is carried out automatically according to the "Smaller box around a solid" criterion, such that the respective zone of interest 804 is the smallest box encompassing the aircraft engine 802. The respective reduced model is then computed S30 at the border 806 of the zone of interest 804. The method then computes S2 each global simulation of a set of three global simulations 82, 84 and 86. The three global simulations 82, 84 and 86 have the same respective global domain 88. Each global domain 88 encompasses a respective variation 820, 840 or 860 of a common physical object that is an aircraft wing. Each variation 820, 840 and 860 is a different wing shape (or wing profile). Each global simulation 82, 84 and 86 may be a structural and/or CFD physics simulation simulating the assembly of the aircraft engine with the given wing shape of the global simulation, e.g. in given weather and/or flight conditions. During the computing S2 of each global simulation 82, 84 and 86, the region of the global domain 88 occupied by the zone of interest 804 is not computed, only the remaining part of the global domain 88 is computed. Advantageously, the very costly simulation of the engine region is not re-run.

Other examples of the method are hereinafter described with reference to the flowcharts of FIGS. 2 to 5, in the case where the set of local simulations comprises at least two local simulations. Any plausible combination of the following examples of the method with the previous examples of the method may also be contemplated by the present embodiments.

Figure 2:
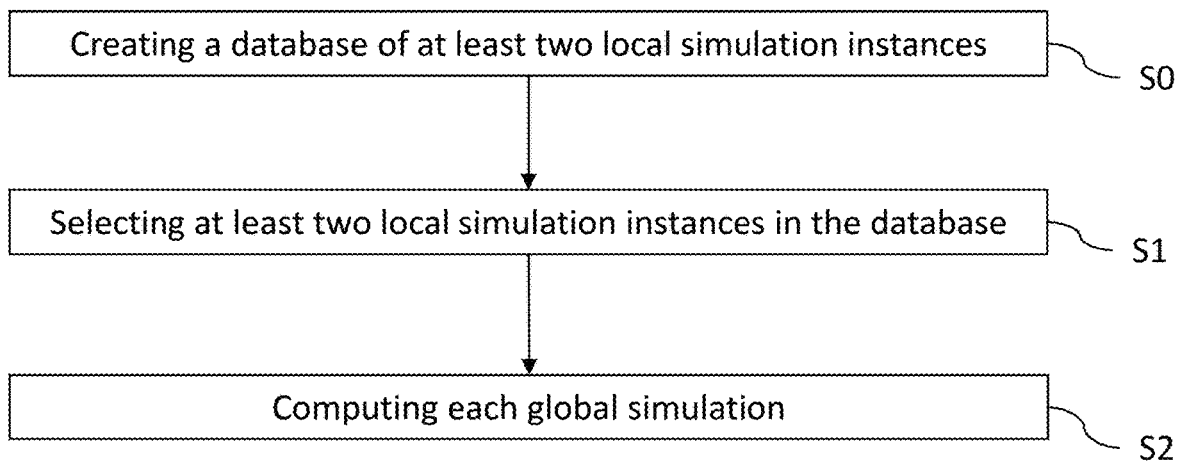
FIG. 2 shows a flowchart of an example of the method in the case where the set of local simulations comprises at least two local simulations.
Figure 3:
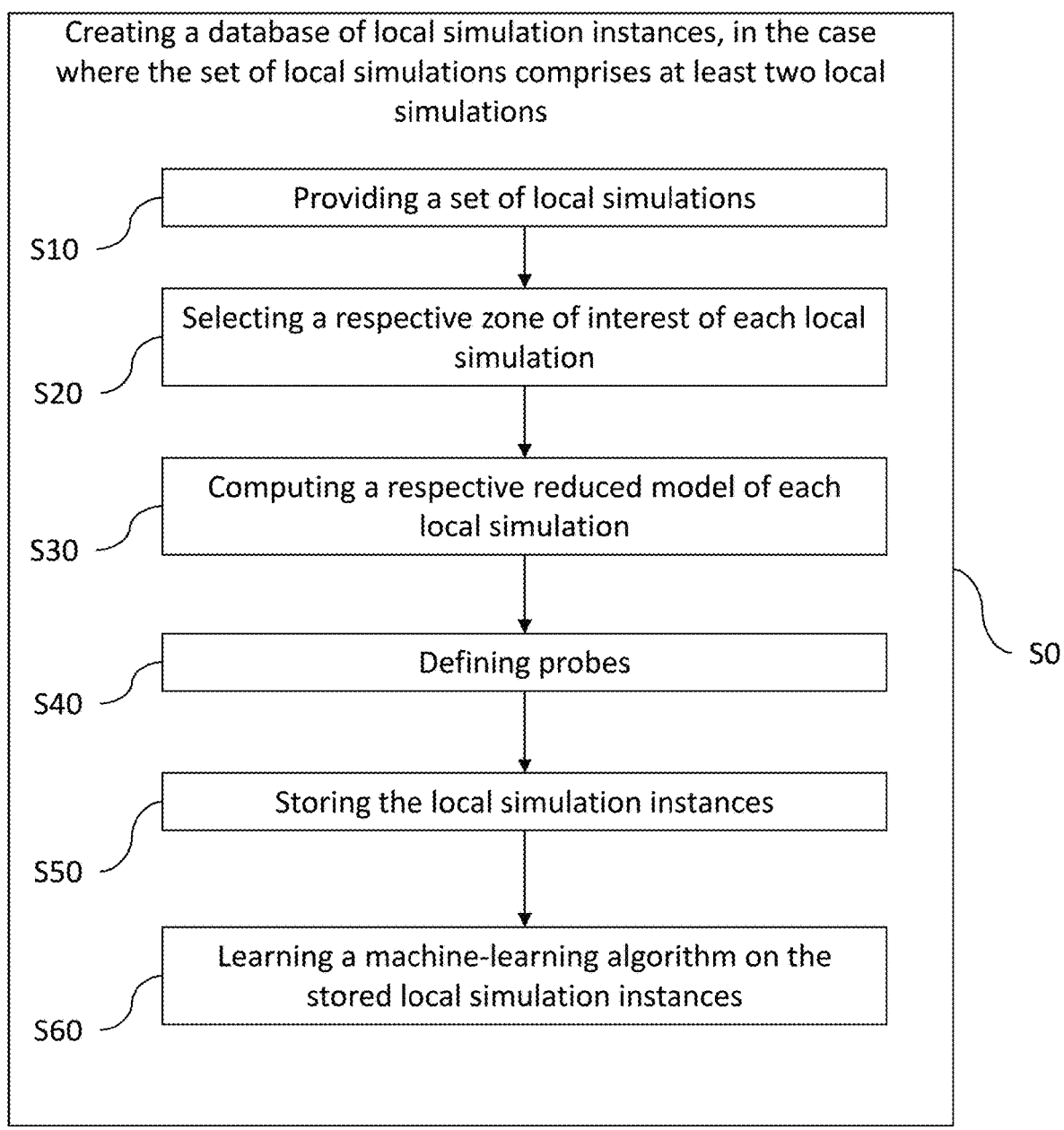
FIG. 3 shows a flowchart of an example of the creating of the database local simulation instances according to the method, in the case where the set of local simulations comprises at least two local simulations.
Figure 4:
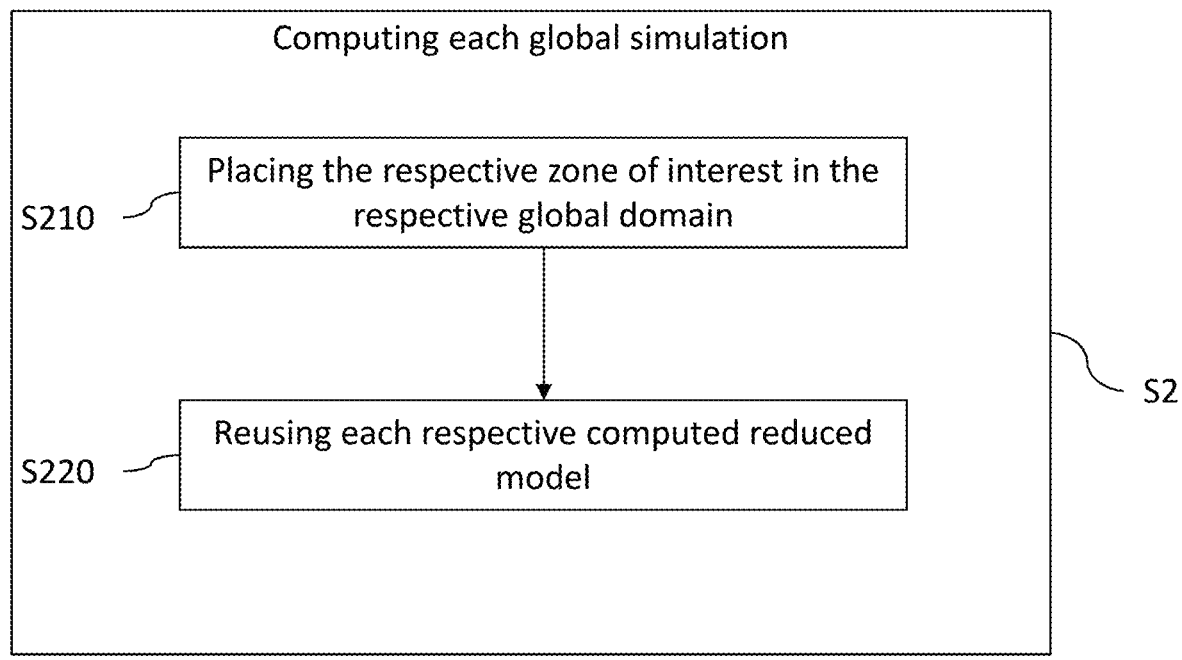
FIG. 4 shows a flowchart of an example of the computing of each global simulation according to the method.
Figure 5:
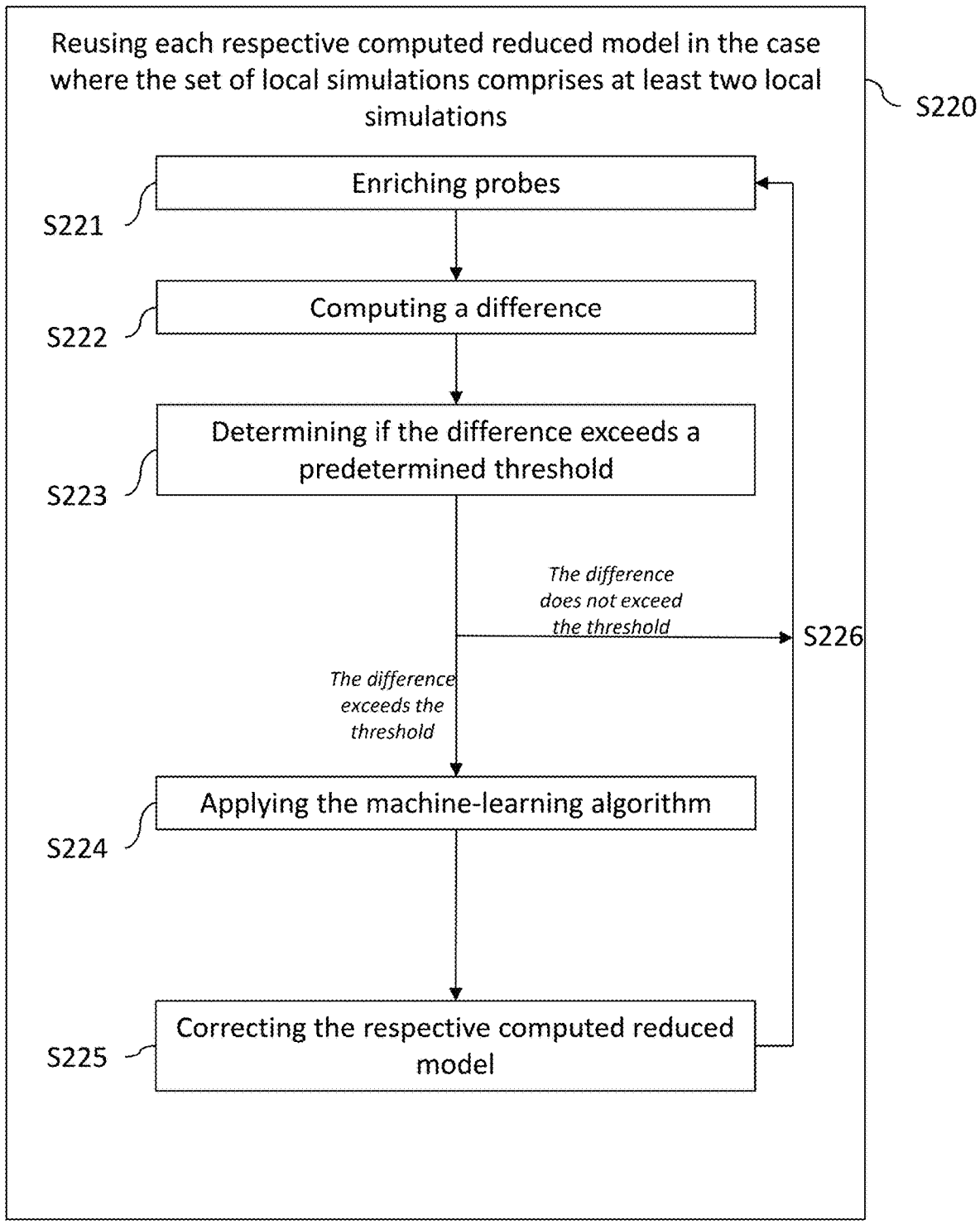
FIG. 5 shows a flowchart of an example of the reusing of each computed reduced model according to the method, in the case where the set of local simulations comprises at least two local simulations.

FIGS. 2 and 3 illustrate examples for which the set of local simulations comprises at least two local simulations. In these examples, the method further comprises, before the computing S2 of each global simulation, creating S0 a database of local simulation instances and selecting S1 at least two local simulation instances in the database of local simulation instances.

FIG. 3 illustrates examples of the creating S0.

In an example of FIG. 3, the creating S0 of the database comprises the providing S10 of the set of local simulations and the computing S30 of each respective reduced model of each local simulation. The creating S0 further comprises, for each local simulation of the set of local simulations, storing S50 in the database a respective local simulation instance. The respective local simulation instance comprises the respective computed reduced model. In these examples, at the computing S2 of each global simulation, the at least one local simulation consists in the at least two local simulations of the at least two selected local simulation instances. It is to be understood that the providing S10, the computing S30 and the computing S2 are performed as discussed in reference to FIGS. 1 and 4.

A local simulation instance of a local simulation forms data representing the local simulation. It comprises the respective computed reduced model of the local simulation. The local simulation instance may further comprise data relative to the local simulation, such as states (and/or data derived from states) of the local simulation and/or simulation results (and/or data derived from simulation results) of the local simulation. Generally speaking, the term "simulation instance (of a simulation)" means a representation and/or an example of the simulation. The database of local simulation instances may also be a library of local simulation instances.

Back to FIG. 2, the selecting S1 of at least two local simulation instances in the database of local simulation instances may be performed upon user action. Typically, a user accesses the database of local simulation instances and selects S1 local simulation instances. It is to be understood that one local simulation instance may be selected S1 at least twice (i.e. twice or more), in which case the at least two local simulation instances comprises at least two exemplars of the same local simulation instance.

Referring back to FIG. 3, in examples, the method further comprises, for each local simulation of the set of local simulations, after the computing S30 of the respective reduced model, defining S40 probes. The probes are points of the respective local domain of the local simulation which are contiguous to the respective zone of interest. Each probe comprises simulation data of the local simulation. In these examples, the stored local simulation instance comprising the respective computed reduced model further comprises the probes and the respective zone of interest.

Defining S40 probes and storing them improves the accuracy of the computing S2 of each global simulations, because local simulation data is stored and may be used for the computing S2 in addition of the respective computed reduced models.

The simulation data comprised in a probe refers to any data derived from simulation results and/or simulation states of the local simulation to which the probe corresponds. Probes (e.g. all of them) may be coupled to the respective computed reduced model to be used in the computation at the reusing step S220 in addition of the computed reduced model itself. The simulation data may also comprise the simulation results and/or the simulation states. In examples, the probes are uniformly distributed on (or substantially on) the border of each zone of interest. This allows to access the same level of simulation data anywhere around the respective zone of interest.

The defining S40 of the probes may be performed semi-automatically, e.g. upon the selecting S20 of the respective zone of interest, in which case the method may automatically create a uniform distribution of probes along the border of the respective zone of interest. In these examples, the user may then select and/or derive and/or retrieve the simulation data and record it on the probes Alternatively, the user may select the locations of the probes and then select and/or derive and/or retrieve the simulation data and record it on the probes. In any case, the defining S40 of the probes comprises the creation of the probes and the selecting and/or the deriving and/or the retrieving of the simulation data and the recording of the simulation data on the created probes.

In examples, the probes and the respective zone of interest are stored S50, FIG. 3. In examples, the number of probes by zone of interest is larger than a predetermined threshold, e.g. chosen upon user action at an initial stage of the method. This ensures to fulfill a certain requirement of accuracy. Indeed, the more there are probes, the more there is simulation data to access and to use at the computing S2 of each global simulation, the better the accuracy of the computing S2.

Figure 12:
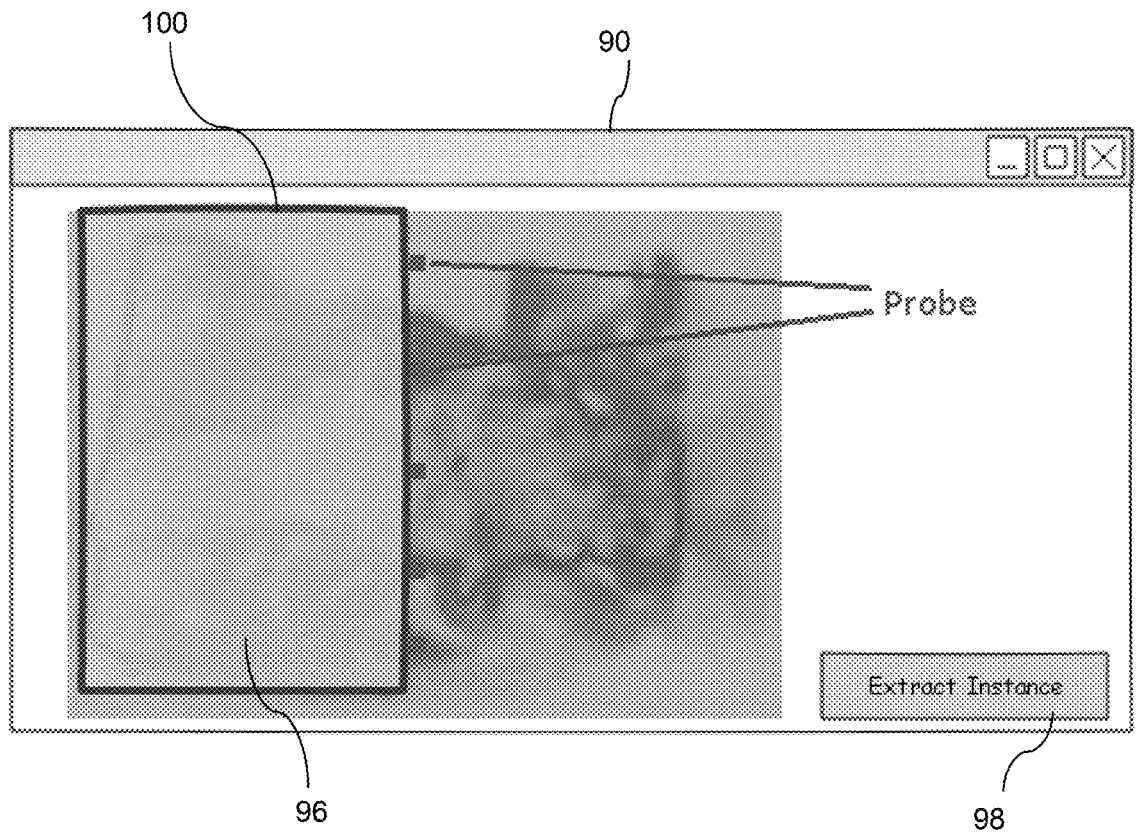
FIG. 12 shows a screenshot illustrating an example of defining the probes.

With reference to FIGS. 9, 10 and 12, an example of defining S40 probes is now described. In this example, the providing S10 of the local simulation 92 and the selecting S20 of the respective zone of interest 96 have been performed according to the examples of FIG. 9 and FIG. 10, described previously. After the selecting S20 of the respective zone of interest 96, the user defines S40 probes substantially on the border 100 of the respective zone of interest 96. For the sake of explanation only, the probes are represented by squares which are contiguous to the border 100 in FIG. 12. Defining S40 a probe may be performed by picking, e.g. upon user interaction with a GUI, the probe's emplacement, that is a point on (or substantially on) the border 100, and a square representing the probe is automatically created substantially at the picking location. The simulation data to be comprised in the probe may be then selected and/or retrieved and recorded in the probe.

Figure 13:
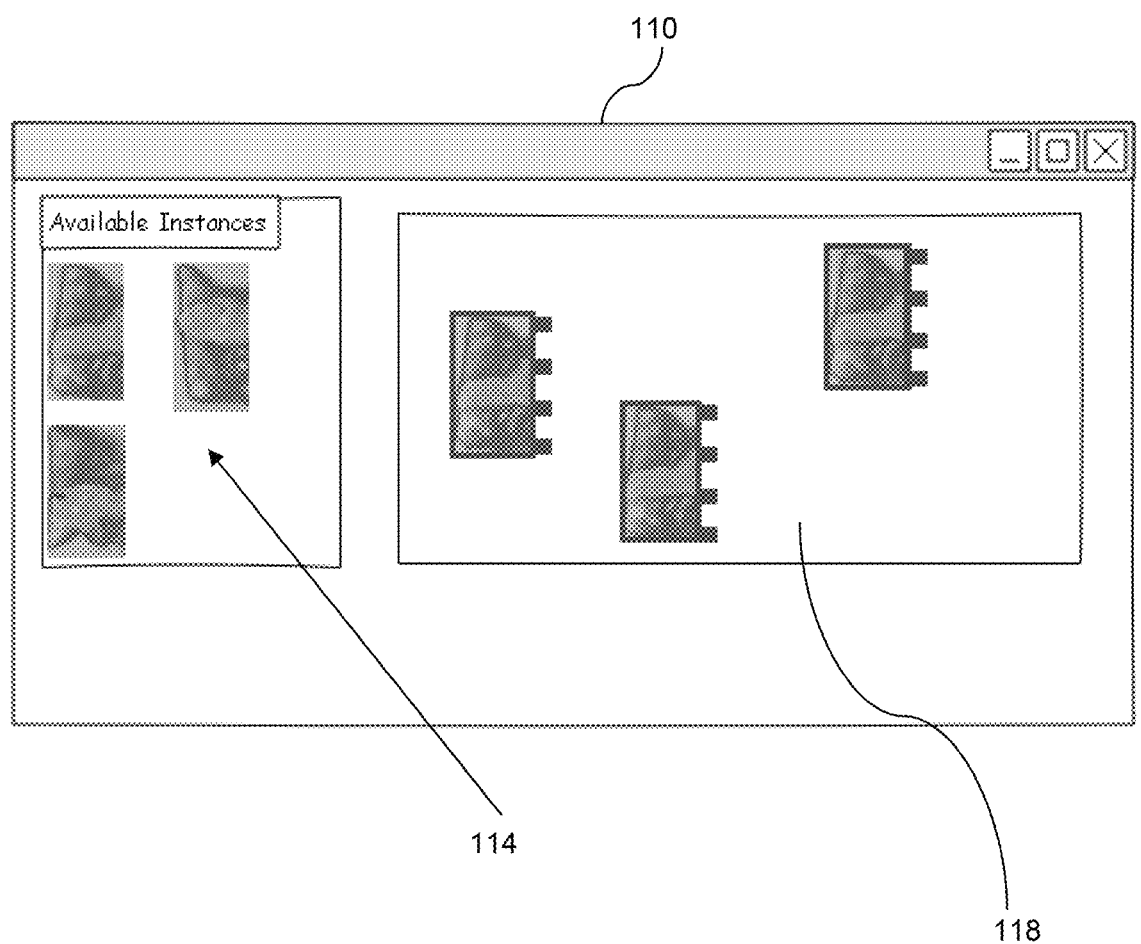
FIG. 13 shows a screenshot illustrating an example of placing respective zones of interests.

An example of the placing S210, in the case where probes have been defined for each local simulation instance, is now described with reference to FIG. 13. In specific, FIG. 13 shows the example of the placing S210 of respective zones of interest of FIG. 11, but with the difference that probes have been defined S40 on all respective zones of interest 114 according to the above example described with reference to FIGS. 9, 10 and 12. In FIG. 13, probes are displayed on the respective zones of interest that have been moved into the global domain 118.

FIG. 8 illustrates examples of the reusing S220 each respective reduced model in the case where the set of local simulations comprises at least two local simulations.

In examples of FIG. 8, during the computing S2 of each global simulation, at least two local simulations instances of the at least two selected local simulation instances interact. The interaction results in that probes of at least one local simulation instance of the at least two local simulation instances are enriched S221. As a result of enriching S221 probes, the respective computed reduced model comprised in a local simulation instance of which probes are enriched is corrected S225.

Interactions between local parts of each global simulation are thus taken into account by the method. These interactions may in fact correspond to (e.g. model) real physics interactions. Thus, the method allows to instantiate the global physics simulation, while handling interactions between instances that may occur in global simulation context. The resulting instances of the global physics simulation are thus more accurate from the physics' point of view.

Two local simulation instances interact when performing the reusing S220 of one respective computed reduced model of one of the two local simulation instances necessitates to correct the respective computed reduced model of the other one of the two local simulation instances to perform the reusing S220 of the respective computed reduced model of said other one of the two local simulation instances, and/or conversely. In examples, the word "necessitates" is to be understood as "theoretically necessitates", which means that a correction of the respective computed reduced model of the other one of the two local simulation instances is needed in theory. However, the method may determine that the interaction is sufficiently weak so that the theoretical correction is in fact not carried out by the method. This point will be detailed later.

An interaction between two local simulation instances, say a first local simulation instance and a second local simulation instance, results in that probes of at least one of the two local simulation instances, say the first local simulation instance, are enriched. Enriching S221 probes means enriching one or more probes. Enriching a probe of the first local simulation instance may comprise adding simulation data to the probe, e.g. simulation data retrieved and/or derived from simulation data of at least one probe of the second local simulation instance. Alternatively or additionally, enriching the probe may comprise removing simulation data already comprised in the probe. Alternatively or additionally, enriching the probe may comprise modifying simulation data already comprised in the probe. It can be understood that, where appropriate, probes of the second local simulation instance or probes of both local simulation instances may be enriched similarly.

Still in reference to examples FIG. 8, the probes of a local simulation instance are related to the respective computed reduced model of the local simulation instance and enriching one or more of the probes triggers (e.g. automatically) a correction of the respective computed reduced model, according to the relation. In examples, correcting S225 the respective reduced model means modifying its (or a part of its) reduced states, e.g. by modifying the (or a part of the) basis elements and/or the (or a part of the) weights, or by modifying the number of state modes contributing to said reduced states (or said part of said reduced states).

In examples, an interaction between two local simulation instances may model and/or simulate a real-world physical interaction among the following list of non-limiting examples:

perturbation(s) of the wind surrounding a wind turbine due to another wind turbine working nearby;
perturbation(s) of the air surrounding an aircraft engine due to another aircraft engine working nearby;
perturbation(s) of the heat surrounding an aircraft engine due to another aircraft engine working nearby;
perturbation(s) of the surrounding magnetic field of a ring in a thermonuclear power plant due to the nearby rings.
perturbation(s) in the antenna radio coverage due to other nearby antenna Any example of global physics simulations recited in table 1 or table 2 may feature one or more plausible examples of interactions taken in the above list. Plausible combinations of the perturbations in the above list may also be contemplated by the method.

In the example of FIG. 13 described above, the probes are displayed on the respective zones of interests that have been moved into the respective global domain 118. In examples, the purpose of such a displaying is to help the user to place the respective zones of interest. Indeed, how the interactions between the local simulation instances are captured may depend on the number of probes and on their positions on each respective zone of interest. By displaying the probes, the user may thus perform the placing S210 of the respective zones of interest to capture the amount of interactions he truly wishes to simulate.

Referring back to FIG. 8, in examples, the method further comprises, for each local simulation instance of which probes are enriched, before the correcting S225 of the respective computed reduced model, computing S222 a difference between the set of all enriched probes and the set of corresponding probes before their enrichment. In these examples, the method further comprises determining S223 if the difference exceeds a predetermined threshold. In these examples, the method further comprises correcting S225 the respective computed reduced model if it is determined that the difference exceeds the predetermined threshold.

By conditioning the correcting S225 of the respective computed reduced model to the determination that the difference exceeds the predetermined threshold, the method only takes into account significant interactions. In examples, this means that the method only takes into account interactions that correspond to (e.g. simulate, model) real-world physical interactions and/or discards interactions that would be due to or correspond to numerical artefacts.

A difference may mean a gap or a discrepancy or an error. It may consist in one or more numerical values expressing how the enriched probes differ from the corresponding (i.e. the same) probes before their enrichment, e.g. how the simulation data of the enriched probes differ from the simulation data of the probes when they were not enriched. The determining S223 that the difference exceeds a predetermined threshold may be carried out automatically by the method. In examples, the predetermined threshold may be chosen upon user action, e.g. at an initial stage of the method.

If it is determined that the difference exceeds the threshold, then the method performs the correcting S225 of the computed reduced model. In examples, the correcting S225 of the computed reduced model may, e.g. in combination with other computations in the computing S2 of the global simulation, trigger a new enrichment S221 of probes. That is, the enrichment S221 and the correcting S225 may be iterated S226 during execution of the computing S2 of the global simulation. If the difference does however not exceed the threshold, then the computed reduced model is not corrected (that is, the computed reduced model is left unchanged). In examples, due to other computations in the computing S2 of the global simulation, a new enrichment S221 of probes may still be contemplated by the method. That is, the enrichment S221 and the determining S223 may be iterated S226 during execution of the computing S2 of the global simulation. In other words, during the computing S2 of each global simulation instance, the method may execute an iteration S226 of: the enriching S221 and the determining S223 and/or the enriching S221 and the correcting S223.

Referring back to FIGS. 3 and 5, in examples, the method further comprises, at the creating S0 of the database of local simulation instances, learning S60 a machine-learning algorithm. The machine-learning algorithm is learnt S60 on the local simulation instances stored in the database. The machine-learning provides, for each local simulation instance of the database, a respective relation between the probes stored in the local simulation instance and the respective computed reduced model stored in the local simulation instance. In these examples, for each local simulation instance, correcting S225 the respective computed reduced model comprised in the local simulation instance comprises applying S224 the machine-learning algorithm. The correcting S225 is performed based on the respective relation.

The machine-learning algorithm acts as a tool to correct S225 a respective computed reduced model. It is learned at the creating S0 of the database and used, where appropriate, at the correcting S225. Thus, interactions are taken into account without the need of recomputing any local simulations, but with the use of information already learned on the computed local simulations.

The machine-learning algorithm may be learned by any known machine-learning technique. Learning on the local simulation instances stored in the database means that the database forms a learning set or a training set of the machine-learning algorithm. Thus, the learning or training set of the machine-learning algorithm comprises all reduced models, probes and zone of interest of all local simulations. The machine-learning algorithm may also be called a correction model For each local simulation instance, the respective relation comprises one or more mathematical formulae and/or one or more algorithms that provide a correspondence between the respective computed reduced model and the probes of the local simulation instance. In examples, the set of all respective relations form a decision forest of the machine-learning algorithm.

For each local simulation instance of which probes are enriched, correcting S225 the respective computed reduced model of the local simulation instance comprises applying S224 the machine learning algorithm only when it has been determined S223 that the difference exceeds the predetermined threshold. In examples, the machine-learning algorithm takes as inputs modes and/or weights (e.g. all of them) and/or data derived from modes and/or weights (e.g. reduced states, e.g. all reduced states) and probes (e.g. all probes, e.g. only the enriched probes) of the local simulation instance. In examples, these inputs are pushed through the set of all respective relations and the machine-learning algorithm outputs a correction of the respective computed reduced model. The correction may consist in a new respective computed reduced model comprising new weights and/or new state modes and/or weights of the non-corrected respective computed reduced model and/or state modes of the non-corrected respective computed reduced model.

In examples, all local simulations of the set of local simulations are perturbations of a given local simulation. In these examples, the given local simulation is also part of the set of local simulations.

In examples, all global simulations are perturbations of a given global simulation. In these examples, the given global simulation is also part of the set of global simulations.

A first simulation is a perturbation of a second simulation if one has defined (e.g. set or programmed) the first simulation by changing one or more of the following features of the second simulation: boundary conditions, initial conditions, space discretization, value of at least one physical parameter, time scale.

In all examples, the method may further comprise, after the computing S2 of each global simulation, the display of all global simulation (e.g. simultaneously or iteratively) on a display such as a GUI.

The invention claimed is:

1. A computer-implemented method for instancing a global physics simulation, the method comprising:
obtaining a set of local simulations, wherein:
the set of local simulations includes at least one local simulation,
each local simulation of the set of local simulations is an independent local simulation within the global physics simulation and simulates a physics model that is simulatable independently from the physics model simulated by the global physics simulation, the global physics simulation simulating a physics model of which simulation depends on simulating each physics model of each local simulation, and
each local simulation of the set of local simulations is already computed;
for each local simulation of the set of local simulations, computing a respective reduced model of the local simulation; and
computing, in an enhanced manner, each global simulation of a set of at least one global simulation, each global simulation being an instance of the global physics simulation, the computing of each global simulation including reusing each respective computed reduced model of each local simulation of at least one local simulation.

2. The method of claim 1,
wherein each local simulation is associated with a respective local domain,
wherein each global simulation is associated with a respective global domain,
wherein the method further comprises: before the computing of each respective reduced model of each local simulation: selecting a respective zone of interest of the local simulation, the respective zone of interest being a non-empty sub-domain of the respective local domain,
wherein at the computing of each respective reduced model of each local simulation: each respective reduced model of each local simulation is computed at the border of the respective zone of interest, and
wherein at the computing of each global simulation:
placing the respective zone of interest of each local simulation of the at least one local simulation in the respective global domain of the global simulation, and
only the remaining part of the global domain is computed, the remaining part being the part of the global domain that is occupied by no zone of interest, the global domain comprising regions that are respectively occupied by each respective zone of interest of each local simulation of the at least one local simulation.

3. The method of claim 2, further comprising, at the placing of the respective zone of interest of each local simulation of the at least one local simulation, interfacing the border of the respective zone of interest with the border of the region of the respective global domain occupied by the respective zone of interest.

4. The method of claim 2, wherein:
each local domain of each local simulation includes a respective physical object, the local simulation simulating a respective physical behavior associated with the respective physical object; and
each global simulation simulates a respective scenario of a common physical behavior associated with all respective physical objects of each local simulation of the at least one local simulation, the common physical behavior being common to all global simulations.

5. The method of claim 4, wherein:
for each global simulation, the respective global domain of the global simulation comprises a respective variation of a common physical object,
the common physical object is common to all global simulations, and
the common physical behavior associated with all respective physical objects of each local simulation of the at least one local simulation is a physical behavior of the common physical object relatively to all respective physical objects of each local simulation of the at least one local simulation.

6. The method of claim 1, the method further comprising:
before the computing of each global simulation:
creating a database of local simulation instances, the creating of the database including:
the obtaining of the set of local simulations and the computing of each respective reduced model of each local simulation, the set of local simulations comprising at least two local simulations, and
for each local simulation of the set of local simulations, storing in the database a respective local simulation instance, the respective local simulation instance comprising the respective computed reduced model, selecting at least two local simulation instances in the database of local simulation instances, wherein at the computing of each global simulation, the at least one local simulation consists in the at least two local simulations of the at least two selected local simulation instances.

7. The method of claim 6, wherein:

each local simulation is associated with a respective local domain, each global simulation is associated with a respective global domain, and wherein the method further comprises:

before the computing of each respective reduced model of each local simulation:

selecting a respective zone of interest of the local simulation, the respective zone of interest being a non-empty sub-domain of the respective local domain, at the computing of each respective reduced model of each local simulation:

each respective reduced model of each local simulation is computed at the border of the respective zone of interest, at the computing of each global simulation:

placing the respective zone of interest of each local simulation of the at least one local simulation in the respective global domain of the global simulation; and only the remaining part of the global domain is computed, the remaining part being the part of the global domain that is occupied by no zone of interest, the global domain comprising regions that are respectively occupied by each respective zone of interest of each local simulation of the at least one local simulation, and wherein the method further comprises, for each local simulation of the set of local simulations, after the computing of the respective reduced model:

defining probes, the probes being points of the respective local domain of the local simulation which are contiguous to the respective zone of interest, each probe comprising simulation data of the local simulation, and wherein the stored local simulation instance comprising the respective computed reduced model further comprises the probes and the respective zone of interest.

8. The method of claim 7, wherein:

during the computing of each global simulation, at least two local simulations instances of the at least two selected local simulation instances interact, the interaction resulting in that probes of at least one local simulation instance of the at least two local simulation instances are enriched, and as a result of enriching probes, the respective computed reduced model comprised in a local simulation instance of which probes are enriched is corrected.

9. The method of claim 8, further comprising, for each local simulation instance of which probes are enriched:

before the correcting of the respective computed reduced model, computing a difference between the set of all enriched probes and the set of corresponding probes before their enrichment:

determining if the difference exceeds a predetermined threshold; and correcting the respective computed reduced model if it is determined that the difference exceeds the predetermined threshold.

10. The method of claim 9, wherein the method further comprises:

at the creating of the database of local simulation instances, learning a machine-learning algorithm on the local simulation instances stored in the database, the machine-learning algorithm providing, for each local simulation instance of the database, a respective relation between the probes stored in the local simulation instance and the respective computed reduced model stored in the local simulation instance, and for each local simulation instance of which probes are enriched, correcting the respective computed reduced model comprised in the local simulation instance comprises applying the machine-learning algorithm, the correcting being performed based on the respective relation.

11. The method of claim 1, wherein the set of local simulations consists in exactly one local simulation.

12. The method of claim 1, wherein all local simulations of the set of local simulations are perturbations of a given local simulation, the given local simulation being also part of the set of local simulations.

13. The method of claim 1, wherein all global simulations are perturbations of a given global simulation, the given global simulation being also part of the set of global simulations.

14. A non-transitory data storage medium having recorded thereon a computer program comprising instructions for performing a method for instancing a global physics simulation, the method comprising:

obtaining a set of local simulations, wherein:

the set of local simulations comprises at least one local simulation, each local simulation of the set of local simulations is an independent local simulation within the global physics simulation and simulates a physics model that is simulatable independently from the physics model simulated by the global physics simulation, the global physics simulation simulating a physics model of which simulation depends on simulating each physics model of each local simulation, and each local simulation of the set of local simulations is already computed;

for each local simulation of the set of local simulations, computing a respective reduced model of the local simulation, and computing, in an enhanced manner, each global simulation of a set of at least one global simulation, each global simulation being an instance of the global physics simulation, the computing of each global simulation comprising reusing each respective computed reduced model of each local simulation of at least one local simulation.

15. The data storage medium of claim 14, wherein:

each local simulation is associated with a respective local domain, each global simulation is associated with a respective global domain, and the method further comprises:

before the computing of each respective reduced model of each local simulation:

selecting a respective zone of interest of the local simulation, the respective zone of interest being a non-empty sub-domain of the respective local domain;

at the computing of each respective reduced model of each local simulation:
computing each respective reduced model of each local simulation is computed at the border of the respective zone of interest; and
at the computing of each global simulation:
placing the respective zone of interest of each local simulation of the at least one local simulation in the respective global domain of the global simulation, and
computing only the remaining part of the global domain, the remaining part being the part of the global domain that is occupied by no zone of interest, the global domain including regions that are respectively occupied by each respective zone of interest of each local simulation of the at least one local simulation.

16. The data storage medium of claim 15, wherein the method further comprises, at the placing of the respective zone of interest of each local simulation of the at least one local simulation, interfacing the border of the respective zone of interest with the border of the region of the respective global domain occupied by the respective zone of interest.

17. The data storage medium of claim 15, wherein:
each local domain of each local simulation includes a respective physical object, the local simulation simulating a respective physical behavior associated with the respective physical object; and
each global simulation simulates a respective scenario of a common physical behavior associated with all respective physical objects of each local simulation of the at least one local simulation, the common physical behavior being common to all global simulations.

18. A system comprising:
a processor coupled to a memory and a display, the memory having recorded thereon a computer program including instructions for instancing a global physics simulation that when executed by the processor causes the processor to be configured to
obtain a set of local simulations, wherein:
    the set of local simulations includes at least one local simulation,
    each local simulation of the set of local simulations is an independent local simulation within the global physics simulation and simulates a physics model that is simulatable independently from the physics model simulated by the global physics simulation, the global physics simulation simulating a physics model of which simulation depends on simulating each physics model of each local simulation, and
    each local simulation of the set of local simulations is already computed;
for each local simulation of the set of local simulations, compute a respective reduced model of the local simulation, and
compute, in an enhanced manner, each global simulation of a set of at least one global simulation, each global simulation being an instance of the global physics simulation, the computing of each global simulation comprising reusing each respective computed reduced model of each local simulation of at least one local simulation.

19. The system of claim 18, wherein:
each local simulation is associated with a respective local domain,
each global simulation is associated with a respective global domain, and
the processor is further configured to
    before the computing of each respective reduced model of each local simulation: select a respective zone of interest of the local simulation, the respective zone of interest being a non-empty sub-domain of the respective local domain,
    at the computing of each respective reduced model of each local simulation: compute each respective reduced model of each local simulation is computed at the border of the respective zone of interest, and
    at the computing of each global simulation:
        place the respective zone of interest of each local simulation of the at least one local simulation in the respective global domain of the global simulation; and
        compute only the remaining part of the global domain, the remaining part being the part of the global domain that is occupied by no zone of interest, the global domain including regions that are respectively occupied by each respective zone of interest of each local simulation of the at least one local simulation.

20. The system of claim 19, wherein the processor is further configured to, at the placing of the respective zone of interest of each local simulation of the at least one local simulation, interface the border of the respective zone of interest with the border of the region of the respective global domain occupied by the respective zone of interest.

* * * * *